United States Patent
Anthony et al.

(10) Patent No.: US 7,675,729 B2
(45) Date of Patent: **\*Mar. 9, 2010**

(54) INTERNALLY SHIELDED ENERGY CONDITIONER

(75) Inventors: David Anthony, Erie, PA (US);
Anthony Anthony, Erie, PA (US);
William M. Anthony, Erie, PA (US);
James Muccioli, Farmington Hills, MI (US); Richard A. Neifeld, Arlington, VA (US)

(73) Assignee: X2Y Attenuators, LLC, Erie, PA (US)

( * ) Notice: Subject to any disclaimer, the term of this patent is extended or adjusted under 35 U.S.C. 154(b) by 655 days.

This patent is subject to a terminal disclaimer.

(21) Appl. No.: 10/582,758

(22) PCT Filed: Dec. 22, 2004

(86) PCT No.: PCT/US2004/039777
§ 371 (c)(1),
(2), (4) Date: Jun. 13, 2006

(87) PCT Pub. No.: WO2005/065097
PCT Pub. Date: Jul. 21, 2005

(65) Prior Publication Data
US 2007/0109709 A1    May 17, 2007

Related U.S. Application Data

(60) Provisional application No. 60/530,987, filed on Dec. 22, 2003.

(51) Int. Cl.
*H02H 9/00* (2006.01)

(52) U.S. Cl. .................................................... 361/118
(58) Field of Classification Search ................. 361/111, 361/118
See application file for complete search history.

(56) References Cited

U.S. PATENT DOCUMENTS

| | | | |
|---|---|---|---|
| 3,240,621 A | 3/1966 | Flower, Jr. et al. |
| 3,343,034 A | 9/1967 | Ovshinsky |
| 3,573,677 A | 4/1971 | Detar |
| 3,736,471 A | 5/1973 | Donze et al. |
| 3,742,420 A | 6/1973 | Harnden, Jr. |
| 3,790,858 A | 2/1974 | Brancaleone et al. |
| 3,842,374 A | 10/1974 | Schlicke |

(Continued)

FOREIGN PATENT DOCUMENTS

DE        197 28 692 A1      1/1999

(Continued)

OTHER PUBLICATIONS

Oct. 1, 2002, PCT International Search Report for PCT/US01/48861, Of Record.

(Continued)

*Primary Examiner*—Stephen W Jackson
(74) *Attorney, Agent, or Firm*—Kenneth C. Spafford

(57) ABSTRACT

An energy conditioner structure comprising a first electrode (120), a second electrode (80), and a shield structure (70, 110, 150) provides improved energy conditioning in electrical circuits. The structures may exist as discrete components or part of an integrated circuit. The shield structure in the energy conditioner structure does not electrically connect to any circuit element.

34 Claims, 22 Drawing Sheets

U.S. PATENT DOCUMENTS

| | | |
|---|---|---|
| 4,023,071 A | 5/1977 | Fussell |
| 4,119,084 A | 10/1978 | Eckels |
| 4,135,132 A | 1/1979 | Tafjord |
| 4,139,783 A | 2/1979 | Engeler |
| 4,191,986 A | 3/1980 | ta Huang et al. |
| 4,198,613 A | 4/1980 | Whitley |
| 4,259,604 A | 3/1981 | Aoki |
| 4,262,317 A | 4/1981 | Baumbach |
| 4,275,945 A | 6/1981 | Krantz et al. |
| 4,292,558 A | 9/1981 | Flick et al. |
| 4,308,509 A | 12/1981 | Tsuchiya et al. |
| 4,320,364 A | 3/1982 | Sakamoto et al. |
| 4,335,417 A | 6/1982 | Sakshaug et al. |
| 4,353,044 A | 10/1982 | Nossek |
| 4,366,456 A | 12/1982 | Ueno et al. |
| 4,384,263 A | 5/1983 | Neuman et al. |
| 4,394,639 A | 7/1983 | McGalliard |
| 4,412,146 A | 10/1983 | Futterer et al. |
| 4,494,092 A | 1/1985 | Griffin et al. |
| 4,533,931 A | 8/1985 | Mandai et al. |
| 4,553,114 A | 11/1985 | English et al. |
| 4,563,659 A | 1/1986 | Sakamoto |
| 4,586,104 A | 4/1986 | Standler |
| 4,587,589 A | 5/1986 | Marek |
| 4,590,537 A | 5/1986 | Sakamoto |
| 4,592,606 A | 6/1986 | Mudra |
| 4,612,140 A | 9/1986 | Mandai |
| 4,612,497 A | 9/1986 | Ulmer |
| 4,636,752 A | 1/1987 | Saito |
| 4,682,129 A | 7/1987 | Bakermans et al. |
| 4,685,025 A | 8/1987 | Carlomagno |
| 4,688,151 A | 8/1987 | Kraus et al. |
| 4,694,265 A | 9/1987 | Kupper |
| 4,698,721 A | 10/1987 | Warren |
| 4,703,386 A | 10/1987 | Speet et al. |
| 4,712,062 A | 12/1987 | Takamine |
| 4,713,540 A | 12/1987 | Gilby et al. |
| 4,720,760 A | 1/1988 | Starr |
| 4,746,557 A | 5/1988 | Sakamoto et al. |
| 4,752,752 A | 6/1988 | Okubo |
| 4,760,485 A | 7/1988 | Ari et al. |
| 4,772,225 A | 9/1988 | Ulery |
| 4,777,460 A | 10/1988 | Okubo |
| 4,780,598 A | 10/1988 | Fahey et al. |
| 4,782,311 A | 11/1988 | Ookubo |
| 4,789,847 A | 12/1988 | Sakamoto et al. |
| 4,793,058 A | 12/1988 | Venaleck |
| 4,794,485 A | 12/1988 | Bennett |
| 4,794,499 A | 12/1988 | Ott |
| 4,795,658 A | 1/1989 | Kano et al. |
| 4,799,070 A | 1/1989 | Nishikawa |
| 4,801,904 A | 1/1989 | Sakamoto et al. |
| 4,814,295 A | 3/1989 | Mehta |
| 4,814,938 A | 3/1989 | Arakawa et al. |
| 4,814,941 A | 3/1989 | Speet et al. |
| 4,819,126 A | 4/1989 | Komrumpf et al. |
| 4,845,606 A | 7/1989 | Herbert |
| 4,847,730 A | 7/1989 | Konno et al. |
| 4,904,967 A | 2/1990 | Morii et al. |
| 4,908,586 A | 3/1990 | Kling et al. |
| 4,908,590 A | 3/1990 | Sakamoto et al. |
| 4,924,340 A | 5/1990 | Sweet |
| 4,942,353 A | 7/1990 | Herbert et al. |
| 4,967,315 A | 10/1990 | Schelhorn |
| 4,978,906 A | 12/1990 | Herbert et al. |
| 4,990,202 A | 2/1991 | Murata et al. |
| 4,999,595 A | 3/1991 | Azumi et al. |
| 5,029,062 A | 7/1991 | Capel |
| 5,034,709 A | 7/1991 | Azumi et al. |
| 5,034,710 A | 7/1991 | Kawaguchi |
| 5,051,712 A | 9/1991 | Naito et al. |
| 5,059,140 A | 10/1991 | Philippson et al. |
| 5,065,284 A | 11/1991 | Hernandez |
| 5,073,523 A | 12/1991 | Yamada et al. |
| 5,079,069 A | 1/1992 | Howard et al. |
| 5,079,223 A | 1/1992 | Maroni |
| 5,079,669 A | 1/1992 | Williams |
| 5,089,688 A | 2/1992 | Fang et al. |
| 5,105,333 A | 4/1992 | Yamano et al. |
| 5,107,394 A | 4/1992 | Naito et al. |
| 5,109,206 A | 4/1992 | Carlile |
| 5,140,297 A | 8/1992 | Jacobs et al. |
| 5,140,497 A | 8/1992 | Kato et al. |
| 5,142,430 A | 8/1992 | Anthony |
| 5,148,005 A | 9/1992 | Fang et al. |
| 5,155,655 A | 10/1992 | Howard et al. |
| 5,161,086 A | 11/1992 | Howard et al. |
| 5,167,483 A | 12/1992 | Gardiner |
| 5,173,670 A | 12/1992 | Naito et al. |
| 5,179,362 A | 1/1993 | Okochi et al. |
| 5,181,859 A | 1/1993 | Foreman et al. |
| 5,186,647 A | 2/1993 | Denkmann et al. |
| 5,208,502 A | 5/1993 | Yamashita et al. |
| 5,219,812 A | 6/1993 | Doi et al. |
| 5,220,480 A | 6/1993 | Kershaw, Jr. et al. |
| 5,236,376 A | 8/1993 | Cohen |
| 5,243,308 A | 9/1993 | Shusterman et al. |
| 5,251,092 A | 10/1993 | Brady et al. |
| 5,257,950 A | 11/1993 | Lenker et al. |
| 5,261,153 A | 11/1993 | Lucas |
| 5,262,611 A | 11/1993 | Danysh et al. |
| 5,268,810 A | 12/1993 | DiMarco et al. |
| 5,290,191 A | 3/1994 | Foreman et al. |
| 5,299,956 A | 4/1994 | Brownell et al. |
| 5,300,760 A | 4/1994 | Batliwalla et al. |
| 5,310,363 A | 5/1994 | Brownell et al. |
| 5,311,408 A | 5/1994 | Ferchau et al. |
| 5,321,373 A | 6/1994 | Shusterman et al. |
| 5,321,573 A | 6/1994 | Person et al. |
| 5,326,284 A | 7/1994 | Bohbot et al. |
| 5,337,028 A | 8/1994 | White |
| 5,353,189 A | 10/1994 | Tomlinson |
| 5,353,202 A | 10/1994 | Ansell et al. |
| 5,357,568 A | 10/1994 | Pelegris |
| 5,362,249 A | 11/1994 | Carter |
| 5,362,254 A | 11/1994 | Siemon et al. |
| 5,378,407 A | 1/1995 | Chandler et al. |
| 5,382,928 A | 1/1995 | Davis et al. |
| 5,382,938 A | 1/1995 | Hansson et al. |
| 5,386,335 A | 1/1995 | Amano et al. |
| 5,396,201 A | 3/1995 | Ishizaki et al. |
| 5,401,952 A | 3/1995 | Sugawa |
| 5,405,466 A | 4/1995 | Naito et al. |
| 5,414,393 A | 5/1995 | Rose et al. |
| 5,414,587 A | 5/1995 | Kiser et al. |
| 5,420,553 A | 5/1995 | Sakamoto et al. |
| 5,432,484 A | 7/1995 | Klas et al. |
| 5,446,625 A | 8/1995 | Urbish et al. |
| 5,450,278 A | 9/1995 | Lee et al. |
| 5,451,919 A | 9/1995 | Chu et al. |
| RE35,064 E | 10/1995 | Hernandez |
| 5,455,734 A | 10/1995 | Foreman et al. |
| 5,461,351 A | 10/1995 | Shusterman |
| 5,463,232 A | 10/1995 | Yamashita et al. |
| 5,471,035 A | 11/1995 | Holmes |
| 5,477,933 A | 12/1995 | Nguyen |
| 5,481,238 A | 1/1996 | Carsten et al. |
| 5,483,407 A | 1/1996 | Anastasio et al. |
| 5,488,540 A | 1/1996 | Hatta |
| 5,491,299 A | 2/1996 | Naylor et al. |
| 5,493,260 A | 2/1996 | Park |
| 5,495,180 A | 2/1996 | Huang et al. |
| 5,500,629 A | 3/1996 | Meyer |
| 5,500,785 A | 3/1996 | Funada |

| Patent | Date | Inventor |
|---|---|---|
| 5,512,196 A | 4/1996 | Mantese et al. |
| 5,531,003 A | 7/1996 | Seifried et al. |
| 5,534,837 A | 7/1996 | Brandt |
| 5,535,101 A | 7/1996 | Miles et al. |
| 5,536,978 A | 7/1996 | Cooper et al. |
| 5,541,482 A | 7/1996 | Siao |
| 5,544,002 A | 8/1996 | Iwaya et al. |
| 5,546,058 A | 8/1996 | Azuma et al. |
| 5,548,255 A | 8/1996 | Spielman |
| 5,555,150 A | 9/1996 | Newman, Jr. |
| 5,568,348 A | 10/1996 | Foreman et al. |
| 5,570,278 A | 10/1996 | Cross |
| 5,583,359 A | 12/1996 | Ng et al. |
| 5,586,007 A | 12/1996 | Funada |
| 5,592,391 A | 1/1997 | Muyshondt et al. |
| 5,612,657 A | 3/1997 | Kledzik |
| 5,614,881 A | 3/1997 | Duggal et al. |
| 5,619,079 A | 4/1997 | Wiggins et al. |
| 5,624,592 A | 4/1997 | Paustian |
| 5,640,048 A | 6/1997 | Selna |
| 5,645,746 A | 7/1997 | Walsh |
| 5,647,766 A | 7/1997 | Nguyen |
| 5,647,767 A | 7/1997 | Scheer et al. |
| 5,668,511 A | 9/1997 | Furutani et al. |
| 5,682,303 A | 10/1997 | Goad |
| 5,692,298 A | 12/1997 | Goetz et al. |
| 5,700,167 A | 12/1997 | Pharney et al. |
| 5,708,553 A | 1/1998 | Hung |
| 5,719,450 A | 2/1998 | Vora |
| 5,719,477 A | 2/1998 | Tomihari |
| 5,719,750 A | 2/1998 | Iwane |
| 5,751,539 A | 5/1998 | Stevenson et al. |
| 5,767,446 A | 6/1998 | Ha et al. |
| 5,789,999 A | 8/1998 | Barnett et al. |
| 5,790,368 A | 8/1998 | Naito et al. |
| 5,796,568 A | 8/1998 | Baiatu |
| 5,796,595 A | 8/1998 | Cross |
| 5,797,770 A | 8/1998 | Davis et al. |
| 5,808,873 A | 9/1998 | Celaya et al. |
| 5,825,084 A | 10/1998 | Lau et al. |
| 5,825,628 A | 10/1998 | Garbelli et al. |
| 5,828,093 A | 10/1998 | Naito et al. |
| 5,828,272 A | 10/1998 | Romerein et al. |
| 5,828,555 A | 10/1998 | Itoh |
| 5,831,489 A | 11/1998 | Wire |
| 5,834,992 A | 11/1998 | Kato et al. |
| 5,838,216 A | 11/1998 | White et al. |
| 5,867,361 A | 2/1999 | Wolf et al. |
| 5,870,272 A | 2/1999 | Seifried et al. |
| 5,875,099 A | 2/1999 | Maesaka et al. |
| 5,880,925 A | 3/1999 | DuPre et al. |
| 5,889,445 A | 3/1999 | Ritter et al. |
| 5,895,990 A | 4/1999 | Lau |
| 5,898,403 A | 4/1999 | Saitoh et al. |
| 5,898,562 A | 4/1999 | Cain et al. |
| 5,905,627 A | 5/1999 | Brendel et al. |
| 5,907,265 A | 5/1999 | Sakuragawa et al. |
| 5,908,151 A | 6/1999 | Elias |
| 5,909,155 A | 6/1999 | Anderson et al. |
| 5,909,350 A | 6/1999 | Anthony |
| 5,910,755 A | 6/1999 | Mishiro et al. |
| 5,912,809 A | 6/1999 | Steigerwald et al. |
| 5,917,388 A | 6/1999 | Tronche et al. |
| 5,926,377 A | 7/1999 | Nakao et al. |
| 5,928,076 A | 7/1999 | Clements et al. |
| 5,955,930 A | 9/1999 | Anderson et al. |
| 5,959,829 A | 9/1999 | Stevenson et al. |
| 5,959,846 A | 9/1999 | Noguchi et al. |
| 5,969,461 A | 10/1999 | Anderson et al. |
| 5,977,845 A | 11/1999 | Kitahara |
| 5,978,231 A | 11/1999 | Tohya et al. |
| 5,980,718 A | 11/1999 | Van Konynenburg et al. |
| 5,995,352 A | 11/1999 | Gumley |
| 5,999,067 A | 12/1999 | D''Ostilio |
| 5,999,398 A | 12/1999 | Makl et al. |
| 6,004,752 A | 12/1999 | Loewy et al. |
| 6,013,957 A | 1/2000 | Puzo et al. |
| 6,016,095 A | 1/2000 | Herbert |
| 6,018,448 A | 1/2000 | Anthony |
| 6,021,564 A | 2/2000 | Hanson |
| 6,023,406 A | 2/2000 | Kinoshita et al. |
| 6,031,710 A | 2/2000 | Wolf et al. |
| 6,034,576 A | 3/2000 | Kuth |
| 6,034,864 A | 3/2000 | Naito et al. |
| 6,037,846 A | 3/2000 | Oberhammer |
| 6,038,121 A | 3/2000 | Naito et al. |
| 6,042,685 A | 3/2000 | Shinada et al. |
| 6,046,898 A | 4/2000 | Seymour et al. |
| 6,052,038 A | 4/2000 | Savicki |
| 6,061,227 A | 5/2000 | Nogi |
| 6,064,286 A | 5/2000 | Ziegner et al. |
| 6,072,687 A | 6/2000 | Naito et al. |
| 6,075,211 A | 6/2000 | Tohya et al. |
| 6,078,117 A | 6/2000 | Perrin et al. |
| 6,078,229 A | 6/2000 | Funada et al. |
| 6,088,235 A | 7/2000 | Chiao et al. |
| 6,091,310 A | 7/2000 | Utsumi et al. |
| 6,092,269 A | 7/2000 | Yializis et al. |
| 6,094,112 A | 7/2000 | Goldberger et al. |
| 6,094,339 A | 7/2000 | Evans |
| 6,097,260 A | 8/2000 | Whybrew et al. |
| 6,097,581 A | 8/2000 | Anthony |
| 6,104,258 A | 8/2000 | Novak |
| 6,104,599 A | 8/2000 | Ahiko et al. |
| 6,108,448 A | 8/2000 | Song et al. |
| 6,111,479 A | 8/2000 | Myohga et al. |
| 6,120,326 A | 9/2000 | Brooks |
| 6,121,761 A | 9/2000 | Herbert |
| 6,125,044 A | 9/2000 | Cherniski et al. |
| 6,130,585 A | 10/2000 | Whybrew et al. |
| 6,137,392 A | 10/2000 | Herbert |
| 6,142,831 A | 11/2000 | Ashman et al. |
| 6,144,547 A | 11/2000 | Retseptor |
| 6,147,587 A | 11/2000 | Hadano et al. |
| 6,150,895 A | 11/2000 | Steigerwald et al. |
| 6,157,528 A | 12/2000 | Anthony |
| 6,157,547 A | 12/2000 | Brown et al. |
| 6,160,705 A | 12/2000 | Stearns et al. |
| 6,163,454 A | 12/2000 | Strickler |
| 6,163,456 A | 12/2000 | Suzuki et al. |
| 6,165,814 A | 12/2000 | Wark et al. |
| 6,175,287 B1 | 1/2001 | Lampen et al. |
| 6,180,588 B1 | 1/2001 | Walters |
| 6,181,231 B1 | 1/2001 | Bartilson |
| 6,183,685 B1 | 2/2001 | Cowman et al. |
| 6,185,091 B1 | 2/2001 | Tanahashi et al. |
| 6,188,565 B1 | 2/2001 | Naito et al. |
| 6,191,475 B1 | 2/2001 | Skinner et al. |
| 6,191,669 B1 | 2/2001 | Shigemura |
| 6,191,932 B1 | 2/2001 | Kuroda et al. |
| 6,195,269 B1 | 2/2001 | Hino |
| 6,198,123 B1 | 3/2001 | Linder et al. |
| 6,198,362 B1 | 3/2001 | Harada et al. |
| 6,204,448 B1 | 3/2001 | Garland et al. |
| 6,205,014 B1 | 3/2001 | Inomata et al. |
| 6,207,081 B1 | 3/2001 | Sasaki et al. |
| 6,208,063 B1 | 3/2001 | Horikawa |
| 6,208,225 B1 | 3/2001 | Miller |
| 6,208,226 B1 | 3/2001 | Chen et al. |
| 6,208,494 B1 | 3/2001 | Nakura et al. |
| 6,208,495 B1 | 3/2001 | Wieloch et al. |
| 6,208,501 B1 | 3/2001 | Ingalls et al. |
| 6,208,502 B1 | 3/2001 | Hudis et al. |
| 6,208,503 B1 | 3/2001 | Shimada et al. |
| 6,208,521 B1 | 3/2001 | Nakatsuka |
| 6,208,525 B1 | 3/2001 | Imasu et al. |

| | | | | | | |
|---|---|---|---|---|---|---|
| 6,211,754 | B1 | 4/2001 | Nishida et al. | 7,042,303 B2 | 5/2006 | Anthony et al. |
| 6,212,078 | B1 | 4/2001 | Hunt et al. | 7,042,703 B2 | 5/2006 | Anthony et al. |
| 6,215,647 | B1 | 4/2001 | Naito et al. | 7,050,284 B2 | 5/2006 | Anthony |
| 6,215,649 | B1 | 4/2001 | Appelt et al. | 7,106,570 B2 | 9/2006 | Anthony, Jr. et al. |
| 6,218,631 | B1 | 4/2001 | Hetzel et al. | 7,110,227 B2 | 9/2006 | Anthony et al. |
| 6,219,240 | B1 | 4/2001 | Sasov | 7,110,235 B2 | 9/2006 | Anthony, Jr. et al. |
| 6,222,427 | B1 | 4/2001 | Kato et al. | 7,113,383 B2 | 9/2006 | Anthony et al. |
| 6,222,431 | B1 | 4/2001 | Ishizaki et al. | 7,141,899 B2 | 11/2006 | Anthony et al. |
| 6,225,876 | B1 | 5/2001 | Akino et al. | 7,180,718 B2 | 2/2007 | Anthony et al. |
| 6,226,169 | B1 | 5/2001 | Naito et al. | 7,193,831 B2 | 3/2007 | Anthony |
| 6,226,182 | B1 | 5/2001 | Maehara | 7,224,564 B2 | 5/2007 | Anthony |
| 6,229,226 | B1 | 5/2001 | Kramer et al. | 7,262,949 B2 | 8/2007 | Anthony |
| 6,236,572 | B1 | 5/2001 | Teshome et al. | 7,274,549 B2 | 9/2007 | Anthony |
| 6,240,621 | B1 | 6/2001 | Nellissen et al. | 2001/0001989 A1 | 5/2001 | Smith |
| 6,243,253 | B1 | 6/2001 | DuPre et al. | 2001/0002105 A1 | 5/2001 | Brandelik et al. |
| 6,249,047 | B1 | 6/2001 | Corisis | 2001/0002624 A1 | 6/2001 | Khandros et al. |
| 6,249,439 | B1 | 6/2001 | DeMore et al. | 2001/0008288 A1 | 7/2001 | Kimura et al. |
| 6,252,161 | B1 | 6/2001 | Hailey et al. | 2001/0008302 A1 | 7/2001 | Murakami et al. |
| 6,262,895 | B1 | 7/2001 | Forthun | 2001/0008478 A1 | 7/2001 | McIntosh et al. |
| 6,266,228 | B1 | 7/2001 | Naito et al. | 2001/0008509 A1 | 7/2001 | Watanabe |
| 6,266,229 | B1 | 7/2001 | Naito et al. | 2001/0009496 A1 | 7/2001 | Kappel et al. |
| 6,272,003 | B1 | 8/2001 | Schaper | 2001/0010444 A1 | 8/2001 | Pahl et al. |
| 6,281,704 | B2 | 8/2001 | Ngai et al. | 2001/0011763 A1 | 8/2001 | Ushijima et al. |
| 6,282,074 | B1 | 8/2001 | Anthony | 2001/0011934 A1 | 8/2001 | Yamamoto |
| 6,282,079 | B1 | 8/2001 | Nagakari et al. | 2001/0011937 A1 | 8/2001 | Satoh et al. |
| 6,285,109 | B1 | 9/2001 | Katagiri et al. | 2001/0013626 A1 | 8/2001 | Fujii |
| 6,285,542 | B1 | 9/2001 | Kennedy, III et al. | 2001/0015643 A1 | 8/2001 | Goldfine et al. |
| 6,292,350 | B1 | 9/2001 | Naito et al. | 2001/0015683 A1 | 8/2001 | Mikami et al. |
| 6,292,351 | B1 | 9/2001 | Ahiko et al. | 2001/0017576 A1 | 8/2001 | Kondo et al. |
| 6,309,245 | B1 | 10/2001 | Sweeney | 2001/0017579 A1 | 8/2001 | Kurata |
| 6,310,286 | B1 | 10/2001 | Troxel et al. | 2001/0019869 A1 | 9/2001 | Hsu |
| 6,313,584 | B1 | 11/2001 | Johnson et al. | 2001/0020879 A1 | 9/2001 | Takahashi et al. |
| 6,320,547 | B1 | 11/2001 | Fathy et al. | 2001/0021097 A1 | 9/2001 | Ohya et al. |
| 6,324,047 | B1 | 11/2001 | Hayworth | 2001/0022547 A1 | 9/2001 | Murata et al. |
| 6,324,048 | B1 | 11/2001 | Liu | 2001/0023983 A1 | 9/2001 | Kobayashi et al. |
| 6,325,672 | B1 | 12/2001 | Belopolsky et al. | 2001/0024148 A1 | 9/2001 | Gerstenberg et al. |
| 6,327,134 | B1 | 12/2001 | Kuroda et al. | 2001/0028581 A1 | 10/2001 | Yanagisawa et al. |
| 6,327,137 | B1 | 12/2001 | Yamomoto et al. | 2001/0029648 A1 | 10/2001 | Ikada et al. |
| 6,331,926 | B1 | 12/2001 | Anthony | 2001/0031191 A1 | 10/2001 | Korenaga |
| 6,331,930 | B1 | 12/2001 | Kuroda | 2001/0033664 A1 | 10/2001 | Poux et al. |
| 6,342,681 | B1 | 1/2002 | Goldberger et al. | 2001/0035801 A1 | 11/2001 | Gilbert |
| 6,373,673 | B1 | 4/2002 | Anthony | 2001/0035802 A1 | 11/2001 | Kadota |
| 6,388,856 | B1 | 5/2002 | Anthony | 2001/0035805 A1 | 11/2001 | Suzuki et al. |
| 6,395,996 | B1 | 5/2002 | Tsai et al. | 2001/0037680 A1 | 11/2001 | Buck et al. |
| 6,448,873 | B1 | 9/2002 | Mostov | 2001/0039834 A1 | 11/2001 | Hsu |
| 6,456,481 | B1 | 9/2002 | Stevenson | 2001/0040484 A1 | 11/2001 | Kim |
| 6,469,595 | B2 | 10/2002 | Anthony et al. | 2001/0040487 A1 | 11/2001 | Ikata et al. |
| 6,498,710 | B1 | 12/2002 | Anthony | 2001/0040488 A1 | 11/2001 | Gould et al. |
| 6,504,451 | B1 | 1/2003 | Yamaguchi | 2001/0041305 A1 | 11/2001 | Sawada et al. |
| 6,509,807 | B1 | 1/2003 | Anthony et al. | 2001/0043100 A1 | 11/2001 | Tomita et al. |
| 6,510,038 | B1 | 1/2003 | Satou et al. | 2001/0043129 A1 | 11/2001 | Hidaka et al. |
| 6,522,516 | B2 | 2/2003 | Anthony | 2001/0043450 A1 | 11/2001 | Seale et al. |
| 6,549,389 | B2 | 4/2003 | Anthony et al. | 2001/0043453 A1 | 11/2001 | Narwankar et al. |
| 6,563,688 | B2 | 5/2003 | Anthony et al. | 2001/0045810 A1 | 11/2001 | Poon et al. |
| 6,580,595 | B2 * | 6/2003 | Anthony et al. ............. 361/111 | 2001/0048581 A1 | 12/2001 | Anthony et al. |
| 6,594,128 | B2 | 7/2003 | Anthony | 2001/0048593 A1 | 12/2001 | Yamauchi et al. |
| 6,603,372 | B1 | 8/2003 | Ishizaki et al. | 2001/0048906 A1 | 12/2001 | Lau et al. |
| 6,603,646 | B2 | 8/2003 | Anthony et al. | 2001/0050550 A1 | 12/2001 | Yoshida et al. |
| 6,606,011 | B2 | 8/2003 | Anthony et al. | 2001/0050600 A1 | 12/2001 | Anthony et al. |
| 6,606,237 | B1 | 8/2003 | Naito et al. | 2001/0050837 A1 | 12/2001 | Stevenson et al. |
| 6,618,268 | B2 | 9/2003 | Dibene, II et al. | 2001/0052833 A1 | 12/2001 | Enokihara et al. |
| 6,636,406 | B1 | 10/2003 | Anthony | 2001/0054512 A1 | 12/2001 | Belau et al. |
| 6,650,525 | B2 | 11/2003 | Anthony | 2001/0054734 A1 | 12/2001 | Koh et al. |
| 6,687,108 | B1 | 2/2004 | Anthony et al. | 2001/0054756 A1 | 12/2001 | Horiuchi et al. |
| 6,696,952 | B2 | 2/2004 | Zirbes | 2001/0054936 A1 | 12/2001 | Okada et al. |
| 6,717,301 | B2 | 4/2004 | De Daran et al. | 2002/0000521 A1 | 1/2002 | Brown |
| 6,738,249 | B1 | 5/2004 | Anthony et al. | 2002/0000583 A1 | 1/2002 | Kitsukawa et al. |
| 6,806,806 | B2 | 10/2004 | Anthony | 2002/0000821 A1 | 1/2002 | Haga et al. |
| 6,873,513 | B2 | 3/2005 | Anthony | 2002/0000893 A1 | 1/2002 | Hidaka et al. |
| 6,894,884 | B2 | 5/2005 | Anthony, Jr. et al. | 2002/0000895 A1 | 1/2002 | Takahashi et al. |
| 6,950,293 | B2 | 9/2005 | Anthony | 2002/0003454 A1 | 1/2002 | Sweeney et al. |
| 6,954,346 | B2 | 10/2005 | Anthony | 2002/0005880 A1 | 1/2002 | Ashe et al. |
| 6,995,983 | B1 | 2/2006 | Anthony et al. | 2002/0024787 A1 | 2/2002 | Anthony |

| | | | | | |
|---|---|---|---|---|---|
| 2002/0027263 A1 | 3/2002 | Anthony et al. | JP | 05-299292 | 11/1993 |
| 2002/0027760 A1 | 3/2002 | Anthony | JP | 06-053048 | 2/1994 |
| 2002/0044401 A1 | 4/2002 | Anthony et al. | JP | 06-053049 | 2/1994 |
| 2002/0075096 A1 | 6/2002 | Anthony | JP | 06-053075 | 2/1994 |
| 2002/0079116 A1 | 6/2002 | Anthony | JP | 06-053077 | 2/1994 |
| 2002/0089812 A1 | 7/2002 | Anthony et al. | JP | 06-053078 | 2/1994 |
| 2002/0113663 A1 | 8/2002 | Anthony et al. | JP | 06-084695 | 3/1994 |
| 2002/0122286 A1 | 9/2002 | Anthony | JP | 06-151014 | 5/1994 |
| 2002/0131231 A1 | 9/2002 | Anthony | JP | 06-151244 | 5/1994 |
| 2002/0149900 A1 | 10/2002 | Anthony | JP | 06-151245 | 5/1994 |
| 2002/0158515 A1 | 10/2002 | Anthony, Jr. et al. | JP | 06-325977 | 11/1994 |
| 2002/0186100 A1 | 12/2002 | Anthony et al. | JP | 07-235406 | 9/1995 |
| 2003/0029632 A1 | 2/2003 | Anthony, Jr. et al. | JP | 07-235852 | 9/1995 |
| 2003/0029635 A1 | 2/2003 | Anthony, Jr. et al. | JP | 07-240651 | 9/1995 |
| 2003/0048029 A1 | 3/2003 | DeDaran et al. | JP | 08-124795 | 5/1996 |
| 2003/0067730 A1 | 4/2003 | Anthony et al. | JP | 08-163122 | 6/1996 |
| 2003/0161086 A1 | 8/2003 | Anthony | JP | 08-172025 | 7/1996 |
| 2003/0202312 A1 | 10/2003 | Anthony et al. | JP | 09-232185 | 9/1997 |
| 2003/0206388 A9 | 11/2003 | Anthony et al. | JP | 09-284076 | 10/1997 |
| 2003/0210125 A1 | 11/2003 | Anthony | JP | 09-284077 | 10/1997 |
| 2003/0231451 A1 | 12/2003 | Anthony | JP | 09-284078 | 10/1997 |
| 2003/0231456 A1 | 12/2003 | Anthony et al. | JP | 9-294041 | 11/1997 |
| 2004/0004802 A1 | 1/2004 | Anthony et al. | JP | 11-21456 | 8/1999 |
| 2004/0008466 A1 | 1/2004 | Anthony et al. | JP | 11-214256 | 8/1999 |
| 2004/0027771 A1 | 2/2004 | Anthony | JP | 11-223396 | 8/1999 |
| 2004/0032304 A1 | 2/2004 | Anthony et al. | JP | 11-294908 | 10/1999 |
| 2004/0054426 A1 | 3/2004 | Anthony | JP | 11-305302 | 11/1999 |
| 2004/0085699 A1 | 5/2004 | Anthony | JP | 11-319222 | 11/1999 |
| 2004/0105205 A1 | 6/2004 | Anthony et al. | JP | 11-345273 | 12/1999 |
| 2004/0124949 A1 | 7/2004 | Anthony et al. | WO | WO 91/15046 | 10/1991 |
| 2004/0130840 A1 | 7/2004 | Anthony | WO | WO 97/43786 | 11/1997 |
| 2004/0218332 A1 | 11/2004 | Anthony et al. | WO | WO 98/45921 | 10/1998 |
| 2004/0226733 A1 | 11/2004 | Anthony et al. | WO | WO 99/04457 | 1/1999 |
| 2005/0016761 A9 | 1/2005 | Anthony, Jr. et al. | WO | WO 99/19982 | 4/1999 |
| 2005/0018374 A1 | 1/2005 | Anthony | WO | WO 99/37008 | 7/1999 |
| 2005/0063127 A1 | 3/2005 | Anthony | WO | WO 99/52210 | 10/1999 |
| 2005/0248900 A1 | 11/2005 | Anthony | WO | WO 00/16446 | 3/2000 |
| 2005/0286198 A1 | 12/2005 | Anthony et al. | WO | WO 00/65740 | 11/2000 |
| 2006/0023385 A9 | 2/2006 | Anthony et al. | WO | WO 00/74197 | 12/2000 |
| 2006/0139836 A1 | 6/2006 | Anthony | WO | WO 00/77907 | 12/2000 |
| 2006/0139837 A1 | 6/2006 | Anthony et al. | WO | 01/06631 | 1/2001 |
| 2006/0193051 A1 | 8/2006 | Anthony et al. | WO | WO 01/10000 | 2/2001 |
| 2006/0203414 A1 | 9/2006 | Anthony | WO | WO 01/41232 | 6/2001 |
| 2007/0019352 A1 | 1/2007 | Anthony | WO | WO 01/41233 | 6/2001 |
| 2007/0047177 A1 | 3/2007 | Anthony | WO | WO 01/45119 | 6/2001 |
| 2007/0057359 A1 | 3/2007 | Anthony et al. | WO | WO 01/71908 | 9/2001 |
| 2007/0103839 A1 | 5/2007 | Anthony et al. | WO | WO 01/75916 | 10/2001 |
| 2007/0109709 A1 | 5/2007 | Anthony et al. | WO | WO 01/84581 | 11/2001 |
| | | | WO | WO 01/86774 | 11/2001 |
| | FOREIGN PATENT DOCUMENTS | | WO | WO 02/59401 | 1/2002 |
| DE | 196 57 043 C1 | 3/2000 | WO | WO 02/11160 | 2/2002 |
| DE | 198 57 043 C1 | 3/2000 | WO | WO 02/15360 | 2/2002 |
| EP | 0623363 | 11/1994 | WO | WO 02/27794 | 4/2002 |
| EP | 98915364 | 11/1994 | WO | WO 02/33798 | 4/2002 |
| EP | 8172025 | 7/1996 | WO | WO 02/45233 | 6/2002 |
| EP | 0776016 | 5/1997 | WO | WO 02/65606 | 8/2002 |
| EP | 0933871 | 8/1999 | WO | WO 02/080330 | 10/2002 |
| EP | 1022751 | 7/2000 | WO | WO 03/005541 | 1/2003 |
| EP | 1024507 | 8/2000 | WO | WO 2004/070905 | 8/2004 |
| EP | 1061535 | 12/2000 | WO | WO 2005/002018 | 1/2005 |
| FR | 2765417 | 12/1998 | WO | WO 2005/015719 | 2/2005 |
| FR | 2808135 | 10/2001 | WO | WO 2005/065097 | 7/2005 |
| GB | 2217136 | 4/1988 | WO | WO 2007/103965 | 9/2007 |
| GB | 2341980 | 3/2000 | | | |
| JP | 63-269509 | 11/1988 | | OTHER PUBLICATIONS | |
| JP | 1-27251 | 1/1989 | | | |
| JP | 01-120805 | 5/1989 | Jan. 2, 2003, PCT International Search Report for PCT/US01/44681, | | |
| JP | 01-212415 | 8/1989 | Of Record. | | |
| JP | 02-267879 | 11/1990 | Jan. 1, 1994, Greb, "An Intuitive Approach to EM Fields," EMC Test | | |
| JP | 03-018112 | 1/1991 | & Design, Jan. 1991, pp. 30-33, Of Record. | | |
| JP | 03-71614 | 3/1991 | Dec. 1, 1993, Greb, "An Intuitive Approach to EM Coupling," EMC | | |
| JP | 5-283284 | 10/1993 | Test & Design, Dec. 1993, pp. 20-25, Of Record. | | |

Jun. 1, 1986, Sakamoto, "Noiseproof Power Supplies: What's Important in EMI Removal Filters?" JEE, Jun. 1966, pp. 80-85, Of Record.
Jan. 1, 1999, Montrose, "Analysis on Loop Area Trace Radiated Emissions from Decoupling Capacitor Placement on Printed Circuit Boards," IEEE, 1999, pp. 423-428, Of Record.
Jan. 1, 1999, Miyoshi, "Surface Mounted Distributed Constant Type Noise Filter," IEEE, 1999, pp. 157-160, Of Record.
Jan. 1, 1999, Shigeta et al., "Improved EMI Performance by Use of a Three-Terminal-Capacitor Applied to an IC Power Line," IEEE, 1999, pp. 161-164, Of Record.
Jul. 19, 1999, PCT International Search Report for PCT/US99/07653, Of Record.
Oct. 13, 1999, IPER for PCT/US99/07653, Of Record.
U.S. Appl. No. 10/479,506, Claims 1-46 from Preliminary Amendment filed Dec. 10, 2003, Of Record.
U.S. Appl. No. 10/189,339, Claims 1-41 from Preliminary Amendment filed Oct. 28, 2003, Of Record.
U.S. Appl. No. 10/443,792, Claims 1-41 from Preliminary Amendment filed Oct. 28, 2003, Of Record.
Aug. 19, 1998, PCT International Search Report for PCT/US98/06962, Of Record.
Apr. 19, 1999, PCT International Search Report for PCT/US99/01040, Of Record.
Sep. 18, 2000, PCT International Search Report for PCT/US00/11409, Of Record.
Sep. 13, 2000, PCT International Search Report for PCT/US00/14626, Of Record.
Nov. 8, 2000, PCT International Search Report for PCT/US00/16518, Of Record.
Dec. 28, 2000, PCT International Search Report for PCT/US00/21178, Of Record.
Fang et al., "Conductive Polymers Prolong Circuit Life," Design News, date unknown, 3 pages, Of Record.
Sep. 1, 1996, Carpenter, Jr. et al., "A New Approach to TVSS Design," Power Quality Assurance, Sep./Oct. 1996 p. 60-63, Of Record.
Jan. 1, 1996, Raychem, "Polyswitch Resettable Fuses," Circuit Protection Databook, Jan. 1996, pp. 11-18, Of Record.
Dec. 28, 2001, PCT International Search Report for PCT/US01/41720, Of Record.
Jun. 13, 2001, PCT International Search Report for PCT/US01/09185, Of Record.
Jul. 1, 2000, Polka et al., "Package-Level Interconnect Design for Optimum Electrical Performance," Intel Technology Journal Q3, 2000, pp. 1-17, Of Record.
May 10, 2002, PCT International Search Report for PCT/US01/43418, Of Record.
Mar. 13, 2002, PCT International Search Report for PCT/US01/32480, Of Record.
Aug. 19, 2002, PCT International Search Report for PCT/US02/10302, Of Record.
Feb. 28, 2003, PCT International Search Report for PCT/US02/21238, Of Record.
Mar. 18, 2002, PCT International Search Report for PCT/US01/13911, Of Record.
Jul. 16, 1991, PCT International Search Report for PCT/US91/02150, Of Record.
Jun. 28, 2001, PCT International Search Report for PCT/US01/03792, Of Record.
Dec. 16, 1998, "Johanson Dielectrics, Inc. Licenses X2Y Circuit Conditioning Technology," Press Release, Dec. 16, 1998, 1 page, Of Record.
Mar. 1, 1997, Beyne et al., "PSGA—an innovative IC package for single and multichip designs," Components, Mar. 1997, pp. 6-9, Of Record.
Sep. 15, 1997, "EMC Design for Brush Commutated DC Electric Motors," Sep. 15, 1997, pp. 1-2, Of Record.
Apr. 1, 1996, "Tomorrow's Capacitors," Components, 1996, No. 4, p. 3, Of Record.
Mar. 30, 1998, Mason, "Valor—Understanding Common Mode Noise," Mar. 30, 1998, pp. 1-7, Of Record.

Anthony Anthony et al., Pending specification, claims, figures for U.S. Appl. No. 10/237,079, Claims 21-81; filed Sep. 9, 2002, Of Record.
David Anthony et al., Pending specification, claims, figures for U.S. Appl. No. 10/766,000, Claims 1-63; filed Jan. 29, 2004, Of Record.
William Anthony, Pending specification, claims, figures for U.S. Appl. No. 10/399,630, Claims 1-35; filed Aug. 27, 2003, Of Record.
Anthony Anthony et al., Pending specification, claims, figures for U.S. Appl. No. 10/432,840, Claims 1-39; filed May 28, 2003, Of Record.
William Anthony, Pending specification, claims, figures for U.S. Appl. No. 10/442,483, Claims 1-25; filed Jun. 12, 2003, Of Record.
Anthony Anthony et al., Pending specification, claims, figures for U.S. Appl. No. 10/435,199, Claims 1-32; filed May 12, 2003, Of Record.
Anthony Anthony et al., Pending specification, claims, figures for U.S. Appl. No. 10/115,159, Claims 1-31; filed Apr. 2, 2002, Of Record.
Anthony Anthony et al., Pending specification, claims, figures for U.S. Appl. No. 10/189,338, Claims 1-69; filed Jul. 2, 2002, Of Record.
Anthony Anthony et al., Pending specification, claims, figures for U.S. Appl. No. 10/189,339, Claims 1-41; filed Jul. 2, 2002, Of Record.
Anthony Anthony et al., Pending specification, claims, figures for U.S. Appl. No. 10/479,506, Claims 1-46; filed Dec. 10, 2003, Of Record.
Anthony Anthony, Pending specification, claims, figures for U.S. Appl. No. 10/443,764, Claims 26-40; filed Sep. 16, 2003, Of Record.
Anthony Anthony, Pending specification, claims, figures for U.S. Appl. No. 10/443,792, Claims 1-41; filed May 23, 2003, Of Record.
Anthony Anthony, Pending specification, claims, figures for U.S. Appl. No. 10/443,788, Claims 1; 21-45; filed May 23, 2003, Of Record.
Anthony Anthony et al., Pending specification, claims, figures for U.S. Appl. No. 10/443,778, Claims 1; 21-59; filed May 23, 2003, Of Record.
Anthony Anthony et al., Pending specification, claims, figures for U.S. Appl. No. 10/460,361, Claims 1-16; filed Jun. 13, 2003, Of Record.
Anthony Anthony et al., Pending specification, claims, figures for U.S. Appl. No. 10/705,962, Claims 19-33; filed May 25, 2005, Of Record.
Anthony Anthony, Pending specification, claims, figures for U.S. Appl. No. 10/369,335, Claims 1-20; filed Feb. 18, 2003, Of Record.
Anthony Anthony et al., Pending specification, claims, figures for U.S. Appl. No. 09/647,648, Claims 1-48; filed Nov. 17, 2000, Of Record.
Anthony Anthony, Pending specification, claims, figures for U.S. Appl. No. 10/328,942, Claims 1-20; filed Dec. 23, 2002, Of Record.
Anthony Anthony et al., Pending specification, claims, figures for U.S. Appl. No. 09/632,048, Claims 1-20; filed Aug. 3, 2000, Of Record.
Anthony Anthony et al., Pending specification, claims, figures for U.S. Appl. No. 09/996,355, Claims 1-73; filed Nov. 29, 2001, Of Record.
William Anthony, Pending specification, claims, figures for U.S. Appl. No. 10/023,467, Claims 1-20; filed Dec. 17, 2001, Of Record.
Jan. 1, 2005, Weir, et al., "DesignCon 2005, High Performance FPGA Bypass Networks", Of Record.
Apr. 25, 2002, Pending claims 1-40 and figures (3 pages) for U.S. Appl. No. 10/399,590; the specification is contained in WO 02/33798, filed Oct. 17, 2001, which is the published version of PCT/US01/32480, which is Neifeld Reference: X2YA0015UPCT-US, which is reference F-063 in the Information Disclosure Statement filed Apr. 23, 2004, Of Record.
Feb. 11, 2005, PCT International Search Report for PCT/US04/00218, Of Record.
Feb. 18, 2005, PCT International Search Report for PCT/US04/14539, Of Record.
Mar. 24, 2005, Australian Patent Office Examination Report for SG 200303041-8; Neifeld Ref: X2YA0025UPCT-SG, Of Record.

Apr. 11, 2005, PCT International Search Report for PCT/US04/18938, Of Record.
Nov. 2000, Muccioli, "EMC Society Seattle and Oregon Chapters—New X2Y Filter Technology Emerges as Singles Component Solution for Noise Suppression", Of Record.
Sep. 27, 2005, PCT Corrected IPER for PCT/US04/00218, Of Record.
Nov. 8, 2005, Supplementary Partial European Search Report EP 99916477, Of Record.
Oct. 27, 2005, Supplementary Eiropean Search Report EP 98915364, Of Record.
Dec. 9, 2005, PCT ISR for PCT/US04/39777, Of Record.
May 8, 2006, EP Examination Report for 99916477.5-2215, Of Record.
Australian Examiner's First Report on Patent Application No. 2002320289; mailed Dec. 4, 2006.
Letter from Australian examiner dated Jan. 23, 2007 explaining error in citation contained on item O-096 from this reference citation; the correct reference is cited in this reference citation list: F-039.
Oct. 1, 2002, PCT International Search Report for PCT/US01/48861.
Jan. 2, 2003, PCT International Search Report for PCT/US01/44681.
Jan. 1, 1994, Greb, "An Intuitive Approach to EM Fields," EMC Test & Design, Jan. 1991, pp. 30-33.
Dec. 1, 1993, Greb, "An Intuitive Approach to EM Coupling," EMC Test & Design, Dec. 1993, pp. 20-25.
Jun. 1, 1986, Sakamoto, "Noiseproof Power Supplies: What's Important in EMI Removal Filters?" JEE, Jun. 1986, pp. 80-85.
Jan. 1, 1999, Montrose, "Analysis on Loop Area Trace Radiated Emissions from Decoupling Capacitor Placement on Printed Circuit Boards," IEEE, 1999, pp. 423-428.
Jan. 1, 1999, Miyoshi, "Surface Mounted Distributed Constant Type Noise Filter," IEEE, 1999, pp. 157-160.
Jan. 1, 1999, Shigeta et al., "Improved EMI Performance by Use of a Three-Terminal-Capacitor Applied to an IC Power Line," IEEE, 1999, pp. 161-164.
Jul. 19, 1999, PCT International Search Report for PCT/US99/07653.
Oct. 13, 1999, IPER for PCT/US99/07653.
U.S. Appl. No. 10/479,506, Claims 1-46 from Preliminary Amendment filed Dec. 10, 2003.
U.S. Appl. No. 10/189,339, Claims 1-41 from Preliminary Amendment filed Oct. 28, 2003.
U.S. Appl. No. 10/443,792, Claims 1-41 from Preliminary Amendment filed Oct. 28, 2003.
Aug. 19, 1998, PCT International Search Report for PCT/US98/06962.
Apr. 19, 1999, PCT International Search Report for PCT/US99/01040.
Sep. 18, 2000, PCT International Search Report for PCT/US00/11409.
Sep. 13, 2000, PCT International Search Report for PCT/US00/14626.
Nov. 8, 2000, PCT International Search Report for PCT/US00/16518.
Dec. 28, 2000, PCT International Search Report for PCT/US00/21178.
Fang et al., "Conductive Polymers Prolong Circuit Life," Design News, date unknown, 3 pages.
Sep. 1, 1996, Carpenter, Jr. et al., "A New Approach to TVSS Design," Power Quality Assurance, Sep./Oct. 1996 p. 60-63.
Jan. 1, 1996, Raychem, "Polyswitch Resettable Fuses," Circuit Protection Databook, Jan. 1996, pp. 11-18.
Dac. 28, 2001, PCT International Search Report for PCT/US01/41720.
Jun. 13, 2001, PCT International Search Report for PCT/US01/09185.
Jul. 1, 2000, Polka et al., "Package-Level Interconnect Design for Optimum Electrical Performance," Intel Technology Journal Q3, 2000, pp. 1-17.
May 10, 2002, PCT International Search Report for PCT/US01/43418.
Mar. 13, 2002, PCT International Search Report for PCT/US01/32480.

Aug. 19, 2002, PCT International Search Report for PCT/US02/10302.
Feb. 28, 2003, PCT International Search Report for PCT/US02/21238.
Mar. 18, 2002, PCT International Search Report for PCT/US01/13911.
Jul. 16, 1991, PCT International Search Report for PCT/US91/02150.
Jun. 28, 2001, PCT International Search Report for PCT/US01/03792.
Dec. 16, 1998, "Johanson Dielectrics, Inc. Licenses X2Y Circuit Conditioning Technology," Press Release, Dec. 16, 1998, 1 page.
Mar. 1, 1997, Beyne et al., "PSGA—an innovative IC package for single and multichip designs," Components, Mar. 1997, pp. 6-9.
Sep. 15, 1997, "EMC Design for Brush Commutated DC Electric Motors," Sep. 15, 1997, pp. 1-2.
Apr. 1, 1996, "Tomorrow's Capacitors," Components, 1996, No. 4, p. 3.
Mar. 30, 1998, Mason, "Valor—Understanding Common Mode Noise," Mar. 30, 1998, pp. 1-7.
Anthony Anthony et al., Pending specification, claims, figures for U.S. Appl. No. 10/237,079, Claims 21-81; filed Sep. 9, 2002.
David Anthony et al., Pending specification, claims, figures for U.S. Appl. No. 10/766,000, Claims 1-63; filed Jan. 29, 2004.
William Anthony, Pending specification, claims, figures for U.S. Appl. No. 10/399,630, Claims 1-35; filed Aug. 27, 2003.
Anthony Anthony et al., Pending specification, claims, figures for U.S. Appl. No. 10/432,840, Claims 1-39; filed May 28, 2003.
William Anthony, Pending specification, claims figures for U.S. Appl. No. 10/443,482, Claims 1-25; filed Jun. 12, 2003.
Anthony Anthony et al., Pending specification, claims, figures for U.S. Appl. No. 10/435,199, Claims 1-32; filed May 12, 2003.
Anthony Anthony et al., Pending specification, claims, figures for U.S. Appl. No. 10/115,159, Claims 1-31; filed Apr. 2, 2002.
Anthony Anthony et al., Pending specification, claims, figures for U.S. Appl. No. 10/189,338, Claims 1-69; filed Jul. 2, 2002.
Anthony Anthony et al., Pending specification, claims, figures for U.S. Appl. No. 10/189,339, Claims 1-41; filed Jul. 2, 2002.
Anthony Anthony et al., Pending specification, claims, figures for U.S. Appl. No. 10/479,506, Claims 1-46; filed Dec. 10, 2003.
Anthony Anthony, Pending specification, claims, figures for U.S. Appl. No. 10/443,764, Claims 26-40; filed Sep. 16, 2003.
Anthony Anthony, Pending specification, claims, figures for U.S. Appl. No. 10/443,792, Claims 1-41; filed May 23, 2003.
Anthony Anthony, Pending specification, claims, figures for U.S. Appl. No. 10/443,788, Claims 1; 21-45; filed May 23, 2003.
Anthony Anthony et al., Pending specification, claims, figures for U.S. Appl. No. 10/443,778, Claims 1; 21-59; filed May 23, 2003.
Anthony Anthony et al., Pending specification, claims, figures for U.S. Appl. No. 10/460,361, Claims 1-16; filed Jun. 13, 2003.
Anthony Anthony et al., Pending specification, claims, figures for U.S. Appl. No. 10/705,962, Claims 19-33; filed May 25, 2005.
Anthony Anthony, Pending specification, claims, figures for U.S. Appl. No. 10/369,335, Claims 1-20; Feb. 18, 2003.
Anthony Anthony et al., Pending specification, claims, figures for U.S. Appl. No. 09/647,648, Claims 1-48; filed Nov. 17, 2000.
Anthony Anthony, Pending specification, claims, figures for U.S. Appl. No. 10/328,942, Claims 1-20; filed Dec. 23, 2002.
Anthony Anthony et al., Pending specification, claims, figures for U.S. Appl. No. 09/632,048, Claims 1-20; filed Aug. 3, 2000.
Anthony Anthony et al., Pending specification, claims, figures for U.S. Appl. No. 09/996,355, Claims 1-73; filed Nov. 29, 2001.
William Anthony, Pending specification, claims, figures for U.S. Appl. No. 10/023,467, Claims 1-20; filed Dec. 17, 2001.
Jan. 1, 2005, Weir, et al., "DesignCon 2005, High Performance FPGA Bypass Networks".
Apr. 25, 2002, Pending claims 1-40 and figures (3 pages) for U.S. Appl. No. 10/399,590; the specification is contained in WO 02/33798, filed Oct. 17, 2001, which is the published version of PCT/US01/32480, which is Neifeld Reference: X2YA0015UPCT-US, which is reference F-063 in the Information Disclosure Statement filed Apr. 23, 2004.

Feb. 11, 2005, PCT International Search Report for PCT/US04/00218.

Feb. 18, 2005, PCT International Search Report for PCT/US04/14539.

Mar. 24, 2005, Australian Patent Office Examination Report for SG 200303041-8; Neilfeld Ref: X2YA0025UPCT-SG.

Apr. 11, 2005, PCT International Search Report for PCT/US04/18938.

Nov. 2000, Muccioli, "EMC Society Seattle and Oregon Chapters—New X2Y Filter Technology Emerges as Singles Component Solution for Noise Suppression".

Sep. 27, 2005, PCT Corrected IPER for PCT/US04/00218.

Nov. 8, 2005, Supplementary Partial European Search Report EP 99916477.

Oct. 27, 2005, Supplementary European Search Report EP 98915364.

Dec. 9, 2005, PCT ISR for PCT/US04/39777.

May 8, 2006, EP Examination Report for 99916477.5-2215.

Oct. 31, 2007, PCT International Search Report PCT/US06/06609.

Oct. 31, 2007, PCT Written Opinion of the International Search Authority PCT/US06/06609.

* cited by examiner

Alternative Filter Arrangement

Plan View

Plan View

Metal plate below insulating plane
X2Y' above metal plate
(inductive/capacitive coupling to metal plate)

Circuit with X2Y' (X2Y having
no ground or shielding structure electrode)

Side View

Internal Electrode Pad Locations

Side Sectional View

Optional Metal Casing

A Electrode Pad
B Electrode Pad
Dielectric (Air or Material)

(X2Y 5 Layer Stack)
SHIELD LAYER
B ELECTRODE LAYER
SHIELD LAYER
A ELECTRODE LAYER
SHIELD LAYER

INTERNALLY SHIELDED ENERGY CONDITIONER

CROSS REFERENCE TO RELATED APPLICATIONS

This application is a U.S. national stage entry of international application PCT/US04/39777 filed Dec. 22, 2004, which claims priority to U.S. provisional application 60/530,987, filed Dec. 22, 2003, and the contents of that application is incorporated herein by reference.

BACKGROUND OF THE INVENTION

This invention relates to electrical technology. More specifically, this invention relates to low inductance devices and energy conditioning.

DISCUSSION OF THE BACKGROUND

The word "terminal" means electrically conductive material at the point at which current enters or leaves an electrical device.

The terms "X" capacitor and "line to line capacitor" both mean a two terminal passive lumped circuit element having a capacitance value across the two terminals wherein the two terminals are connected in parallel configuration with a circuit load device. X capacitors are primarily used to prevent electrical droop across loads. That is, X capacitors are typically used to provide a source or sink of electrical energy.

The terms "Y" capacitor and "line to ground capacitor" both mean a two terminal passive lumped circuit element having a capacitance value across the two terminals wherein one of the two terminals is connected to a line which is located in a circuit path between a source and a load and the other terminal is connected to an electrically conductive structure that, in lumped circuit diagrams, is usually shown as a ground. However, the voltage potential of the alleged ground may vary depending upon the amount of charge it receives or distributes. In applications, typically, the alleged ground typically is either an earth ground or a chassis ground. However, for purposes of this application, the internal shield structure described below generally is not electrically connected to an external earth or chassis ground.

Y capacitors are primarily used to filter noise from signals.

One or more lumped circuit elements including X Y capacitors may be fabricated in a single structurally integral electrical device.

The term "plate" is used throughout to refer to structure typically formed by layering processes. Use of the term "plate" therefore does not imply structures that are not integrated during their formation. The term "plate" may refer to elements of structures that are integrated during their formation. The term plate as used herein means a structure with at least two relatively large area major surfaces and one or more relatively smaller area edge surfaces. Each major surface may but need not be flat.

Energy conditioning means at least one of filtering, decoupling, and transient suppression of electrical energy propagating between a source and a load.

Filtering means modifying the frequency spectrum of a signal.

Decoupling is a term typically applied to active circuitry. In such circuitry, active devices change their properties, such as trans-conductance, which affects voltage on coupled elements. Decoupling means the minimization of the affects on the voltage of coupled elements due to the changes in the active circuitry.

Transients include spikes due to external effects, such as static discharges and parasitics, such as self induction induced in a circuit.

A first level interconnect is a structure or device that provides an initial circuit connection to an integrated circuit.

An interposer is a structure or device that provides a circuit connection to an integrated circuit.

U.S. Pat. Nos. 6,018,448 and 6,373,673 disclose a variety of devices that provide electrical energy conditioning. The teachings of U.S. Pat. Nos. 6,018,448 and 6,373,673 are incorporated herein by reference. PCT application PCT/US2004/000218, now published as publication WO 2004/07095, also disclose a variety of devices that provide electrical energy conditioning. The teachings of as published as WO 2004/07095 are also incorporated herein by reference.

The novel inventions disclosed herein are structures that have certain performance characteristics that significantly improve at least the decoupling aspect of electrical energy conditioning compared to the devices described above.

SUMMARY OF THE INVENTION

An object of the invention is to provide a novel structure, a method of making the structure, and a method of using the structure, and related circuit configurations and their use, wherein the structure has a certain capacitance and provides energy conditioning that results in an ultra high insertion loss and improved decoupling.

Another object of the invention is to provide a circuit or a portion of a circuit including a novel structure of the invention, a method of making the circuit, and a method of using the circuit.

Additional objects of the invention are to provide devices, circuits, and methods of using them that provide improved energy conditioning over a wide frequency range.

These and other objects of the invention are provided by a novel energy conditioner structure comprising a first electrode including at least a first electrode plate, a second electrode including at least a second electrode plate, and an internal shield structure that is electrically conductive, the shield structure includes a center shield portion between the first electrode plate and the second electrode plate, and the shield structure includes conductive connecting structures including any of conductive vias, holes filled with conductive material, and plates electrically connecting the elements of the shield structure to electrically connect individual layers of the shield structure into a single conductive structure. The shield structure has no or substantially no region forming an external surface of the novel structure.

The internally connected shield structures elements have certain geometric values, relative values, relative positions, and shapes, relative to each other and relative to the other elements forming the novel structure.

Generally speaking, plates of the an electrode receive electrical energy along any conductive path that connects to that plate to the portion of the electrode forming part of the external surface of the energy conditioner. Each plate may be generally rectangular shaped, having two shorter side edges, and two longer side edges. The electrical connection of that plate to the external surface of its electrode may be via the shorter or the longer side edges of the plate. Similarly, the external surface of each electrode may reside in either a shorter side face or a longer side of the energy conditioner. The inventors have determined that the relative location of the external surface portion and internal connection paths (along shorter or longer sides of generally rectangular energy conditioners) affects device performance.

Preferably, substantially all plates of the first electrode have substantially the same shape and are stacked vertically aligned with one another. Preferably, substantially all plates of the second electrode also have substantially the same shape and are stacked substantially vertically aligned with one another. However, plates of the first electrode and the second electrode may have an axis or plane of symmetry and, if so, plates of the second electrode may oriented in the plate of the plates inverted about the axis or plane of symmetry relative to the plates of the first electrode.

These and other objects of the invention are provided by a novel structure comprising: a first electrode including (A) a first electrode first plate, said first electrode first plate defining (1) a first electrode first plate an inner surface, (2) a first electrode first plate outer surface, and (3) a first electrode first plate edge surface defined by perimeters of said first electrode first plate inner surface and said first electrode first plate outer surface and (B) a first electrode contact region having a first electrode contact region surface for electrically contacting said first electrode; a second electrode including (A) a second electrode first plate, said second electrode first plate defining (1) a second electrode first plate an inner surface, (2) a second electrode first plate outer surface, and (3) a second electrode first plate edge surface defined by perimeters of said second electrode first plate inner surface and said second electrode first plate outer surface and (B) a second electrode contact region having a second electrode contact region surface for electrically contacting said second electrode; a conductive shield structure including (a) a plurality of conductive shield plates including at least (1) an inner shield plate, (2) a first outer shield plate, (3) a second outer shielding plate, and (b a shield plate contact structure for electrically contacting to one another said plurality of conductive shield plates; wherein said first electrode first plate inner surface faces said second electrode first plate inner surface; wherein (A) said inner shield plate is between said a first electrode first plate inner surface and said second electrode first plate inner surface, (B) said first outer shield plate is faced by said first electrode first plate outer surface, and (C) said second outer shielding plate is faced by said second electrode first plate outer surface; and said conductive shield structure is designed to be electrically insulated from a circuit.

The shield structure has substantially no portion having a surface forming a part of the surface of the novel structure. The surface of the novel structure substantially entirely encloses the conductive shield structure.

The elements of said novel structure can have certain geometric values, relative values, relative positions, and shapes.

The novel structures may also include, in the stack of conductive layers, also known as conductive plates, additional first conductive layers as part of the first electrode, additional second conductive layer as part of the second electrode, and additional shield layers as part of the shield structure.

Unlike other shielded energy conditioners, the shield structure of this invention does not include electrodes for electrical connection to circuit elements. This lack of a requirement for shield electrodes for connection to circuit elements enables the novel structures of the invention to have substantially or entirely all of one side thereof residing on a conductive surface while maintaining the shield structure out of electrical contact with all circuit elements.

The energy conditioner novel structures may have some of its surface regions defined by electrically insulating material. The novel energy conditioner structures have surface regions formed by at least one contactable surface of the first electrode and the second electrode. The novel structures may have several electrodes, each of which preferable has layers or plates inside the structure that are substantially shielded from layers of all other electrodes of the structure.

The structure preferably has an electrically insulating material between the conductive layers or plates that thereby substantially prevents electrons from moving from one conductive layer through the insulating material to another conductive layer. The insulating material may be any material that has a dielectric constant. Examples of the insulating material are air, which has a dielectric constant of one, and material specified as X7R, which has a dielectric constant of about 4600, silicon, and semiconductors, and SiN and Diamond semiconductors. Preferably, the dielectric constant is relatively large in order to maximize capacitance per volume. However, the dielectric constant may be set at least in semiconductor applications by dielectric layers compatible with the semiconductor in question.

The certain geometric values, relative values, relative positions, and shapes of structures of the invention include shapes of each of the plates in the plane defined by the major surfaces of those plates, the locations and relative extensions of the conductive layer contact regions where electrical energy connects to each plate, the thickness of each plate, the spacing between adjacent plates, and the alignment of plates relative to one another.

The energy conditioner structures of the invention may include additional internal structural elements, such as electrically conductive wire lines, conductive via connecting structures, and conductive layer edge interconnection structure The energy conditioner structures of the invention may include interior surfaces defining apertures in the plates through which electrically conductive lines extend. The apertures may form part of vias or tubular-shaped regions extending between plates or layers in the structure. The vias or tubular regions may be filled with material, electrical or conductive, or remain as apertures, that is, not filled with material. These electrically conducting lines may electrically connect to plates of the same electrode or the shield structure while extending through apertures in plates of other electrodes and remaining insulated from those other electrodes or the shield structure as the case may be. The electrode edge interconnection structure, if it exists, serves to electrically interconnect plates of the same electrode to one another, and electrically connects to an edge of plates of the electrode.

The plates of the shield structure are electrically connected to one another. The plates of the shield structure and the conductive structure electrically inter-connecting the plates of the shield structure to one another and substantially enclose the interior plates or layers of the electrodes of the structure of the invention.

A structure of the invention may be formed as a discrete component, such as a component suited for connection to a PC board or for connection to a connector.

Alternatively, a structure of the invention may be formed into and form part of another structure, such as a PC board, a connector, a first level interconnect, an interposer, or an integrated circuit, including monolithic integrated circuits. In discrete component embodiments of the invention, the first electrode includes a contact region surface that defines a portion of a surface of the structure, the second electrode includes a contact region surface that defines a portion of the surface of the structure, and the energy conditioner structure has no surface defined by a portion of the shield structure.

In alternative embodiments, the shield structure may have a surface region defining a recessed portion of the surface of the structure.

Discrete component and PC boards that incorporate the novel structures of the invention may be formed by conventional layering and firing techniques. Wire lines may be either formed monolithically, or formed separately and then inserted into the apertures or formed in the apertures.

In both PC board and integrated circuit embodiments, certain ones of the electrodes' contact region surfaces in discrete component embodiments that define portions of the surface of the structure do not exist, per se. Instead, the regions where those surfaces would otherwise define termination of a discrete component are formed in contact with electrically conductive material connecting to vias extending from and/or through some portion of the PC board, substrate, first level interconnect, interposer integrated circuit beyond the regions containing the first electrode, the second electrode, the shield structure.

Preferably, the inner shield plate extends, in the plane defined by its major surfaces, beyond the edges of adjacent plates of the first and second electrodes such that, with the plate of the first electrode and a plate of the second electrode) also passes through contacts the inner shield plate. An exception exists wherein, in some embodiments, relatively small regions of the plates of each of the first and second electrodes extend beyond the extension of the shield plates where they contact one or more internally positioned conductive layer interconnection structure(s). The internal conductive layer interconnection structure functions to electrically connect substantially all plates of the first electrode to one another substantially all plates of the second electrode to one another. In addition or alternatively, at least a portion of the inner shield plate generally extends a distance beyond the extension of adjacent plates of the first and second electrodes by at least one, preferably at least 5, more preferably at least 10, and most preferably at least 20 times the distance separating the inner shield plate from an adjacent plate.

The electrode plate interconnection structure is a structure that electrically contacts portions of all or substantially all of the plates of the electrode, thereby electrically connecting the plates of the electrode to one another. The electrode plate interconnection structure for one electrode does not, inside of the energy conditioner structure, contact the plates of any other electrode or the shield structure. Electrode interconnection structure typically exists within these discrete components.

In PC board, connectors and integrated circuit embodiments of structures of the invention, there may be no electrode or shield structure edge interconnection structure.

Instead, typically, there will be structure electrically interconnecting all plates of the same electrode or the shield structure which includes electrically conducting wire lines that connect to plates of the same electrode or the shield structure. The electrically conducting wire lines that connect to plates of one electrode do not electrically connect to plates of other electrodes.

No wire lines connect to the shield structure. Preferably, the electrically conducting wire lines connected to plates of one electrode pass through apertures in plates of other electrodes and the plates of the shield structure such that those wire lines do not electrically connect to the plates of the other electrodes or the shield structure.

In addition, as shown in figures herein, in the energy conditioner, to provide for internally located, common shielding conductive vias are provided thereon is arranged between the first and second electrodes sheets and are utilized to electrically connect the internally located, shielding conductive layers to one another.

Conductive coupling or conductive connection is accomplished by one or more via-hole (s) disposed in the respective insulating sheets and coupling to thru each shielding conductive layer as needed. Via structures whether filled or not, are normally found in a non-parallel relationship to the disposed conductive layerings, shielding or non-shielding.

Via structures are normally disposed beyond the perimeter of any non-shielding conductive layers, however it is readily contemplated that vias may be disposed thru the non-shielding conductive layers provided that an insulating area is disposed insuring a direct, but non-conductive relationship between via structures and the various non-shielding layers.

The inventors also contemplate use of the invention in nano technology fabrication wherein the invention provides reduced parasitics between very closely spaced conditioner electrodes.

Parasitic energy that would exist in prior art non shielded capacitors is greatly reduced by containment of each respective electrode within a portion of the conductive shielding structure. The conductive shielding structure may be referred to as a conductive shielding cage-like structure.

Fabricating preferred embodiments of bulk devices includes providing insulating sheets having conductive patterns thereon and in some embodiments via-holes there through, laminating and firing. However, any other fabrication method may be used.

For example, the insulating sheets may be fired before being laminated. In addition, the composite component of various preferred embodiments of the present invention may be produced by the following method. After an insulating layer including a paste insulating material is provided by printing or other suitable methods, a paste conductive material is applied on a surface of the insulating layer to provide a conductive pattern and a via-hole.

Next, the paste insulating material is again applied on the layer to provide another insulating layer. Similarly, by applying the paste insulating material in sequence, a composite component having a multi-layered structure can be produced.

BRIEF DESCRIPTIONS OF THE FIGURES

Figure 23A:
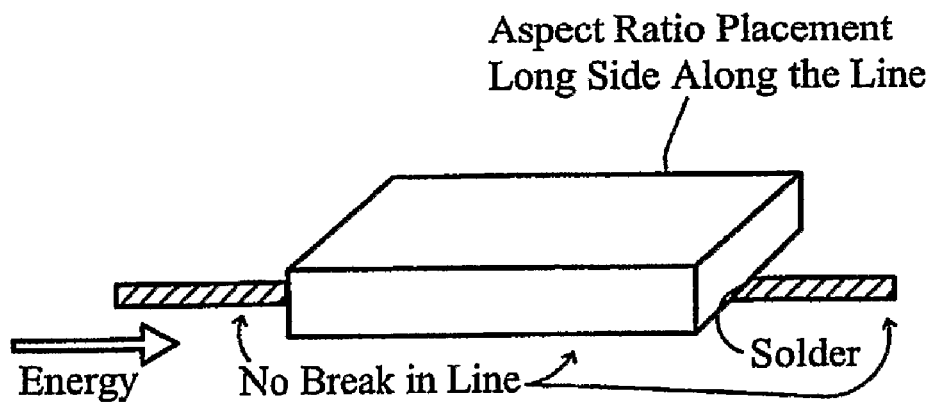
Figure 23B:
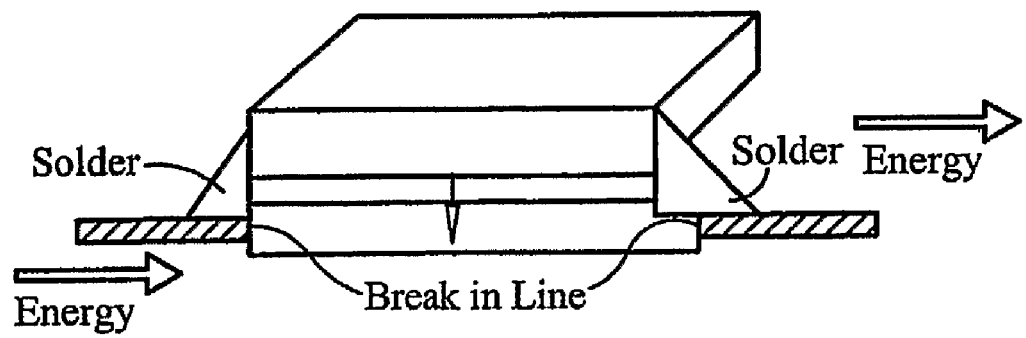
Figure 23C:
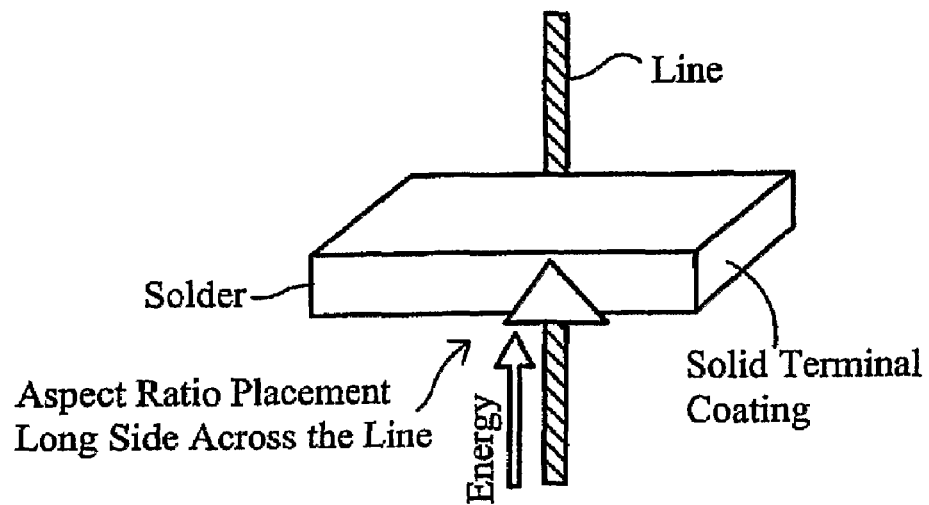
Figure 24:
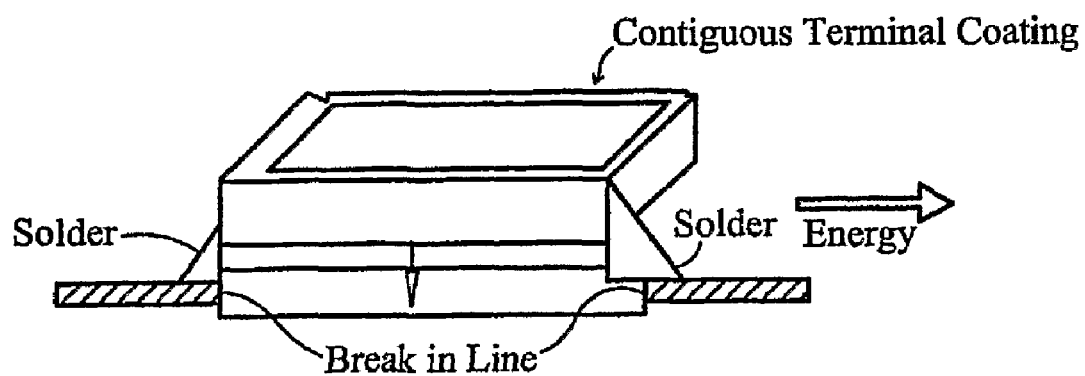
Figure 25A:
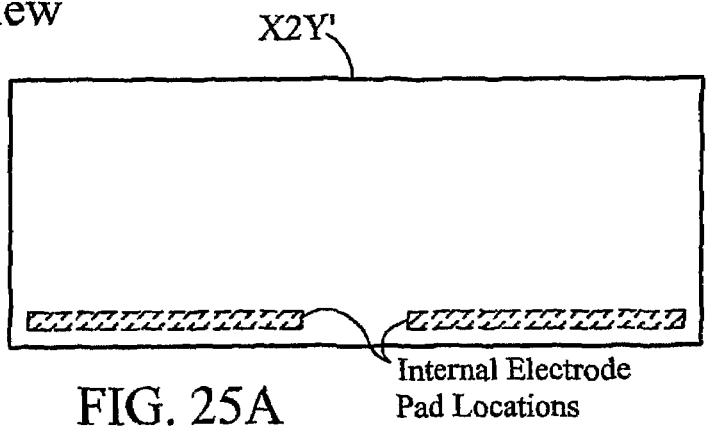
Figure 25B:
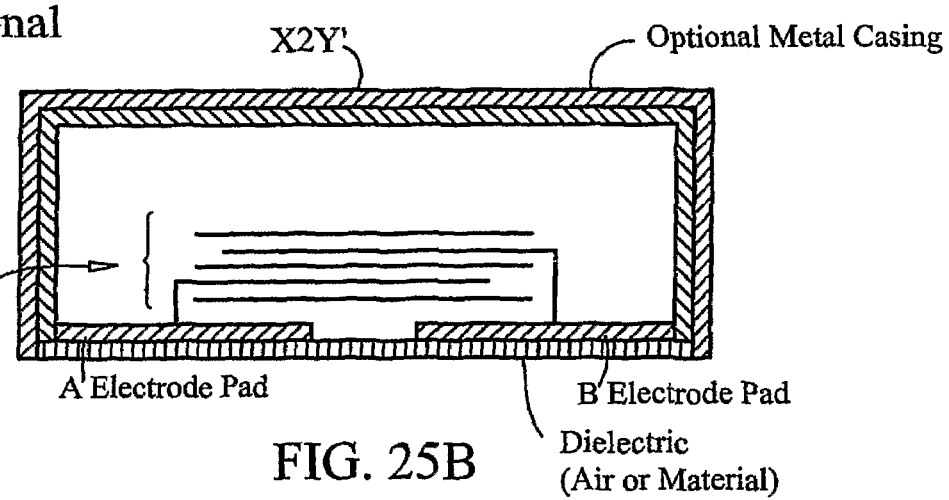
Figure 25C:
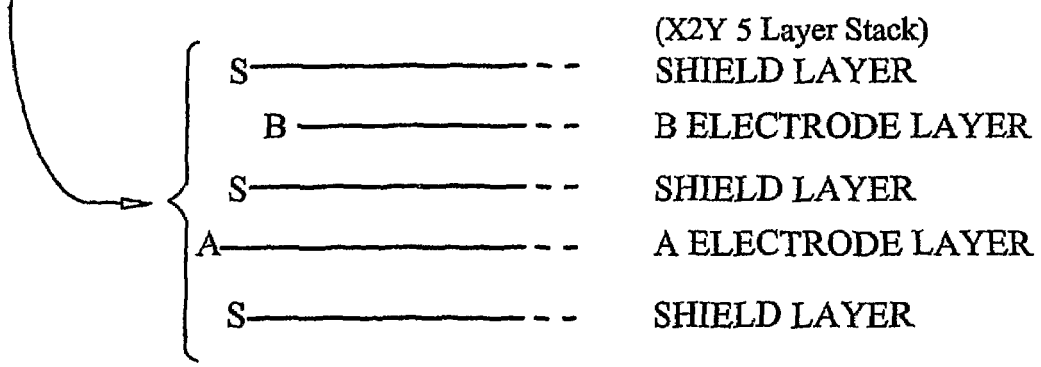
Figure 26A:
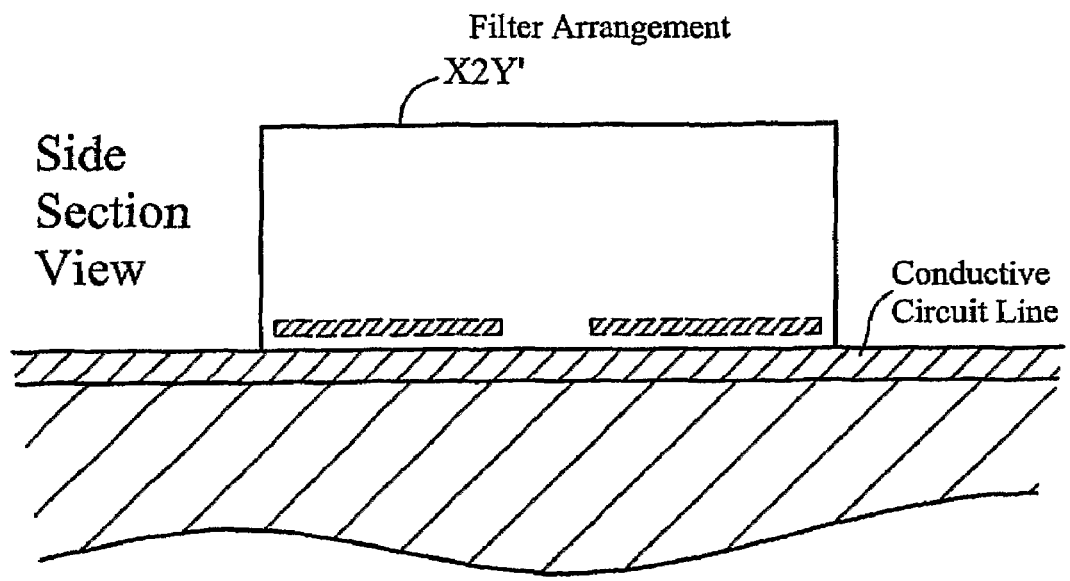
Figure 26B:
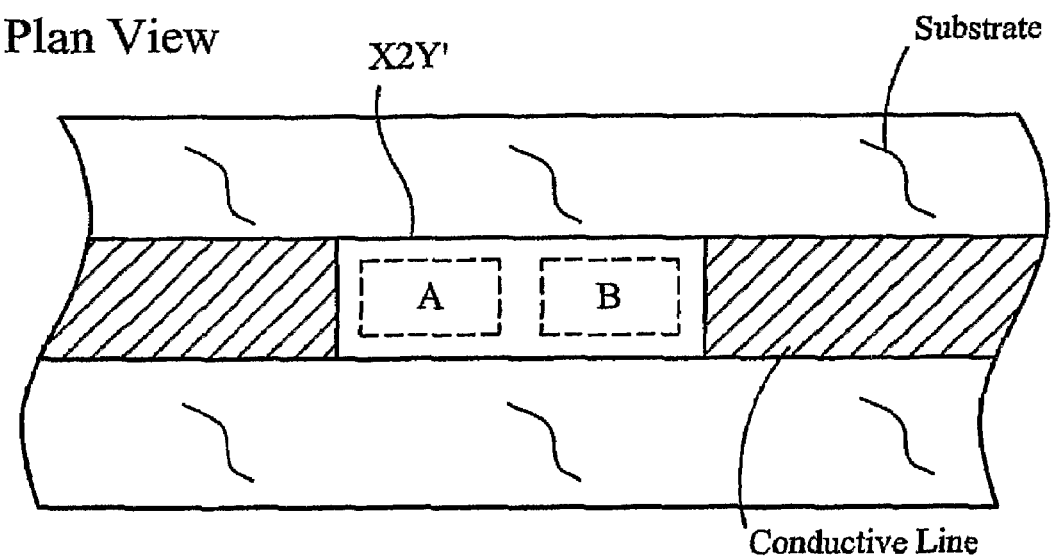

FIGS. 23A-C are perspective views that show filter arrangements including another novel energy conditioner;

FIG. 24 is a perspective view that shows a filter arrangement including another novel energy conditioner in a circuit arrangement;

FIG. 25A is a side schematic view of another novel energy filter;

FIG. 25B is side sectional view of the energy filter of FIG. 25A;

FIG. 25C is a schematic identifying the internal conductive layers shown in FIG. 25B;

FIG. 26A is a side section view of a filter arrangement including the novel energy conditioner illustrated in FIGS. 25A-25C;

FIG. 26B is a plan view of the filter arrangement of FIG. 26A; and

Figure 27:
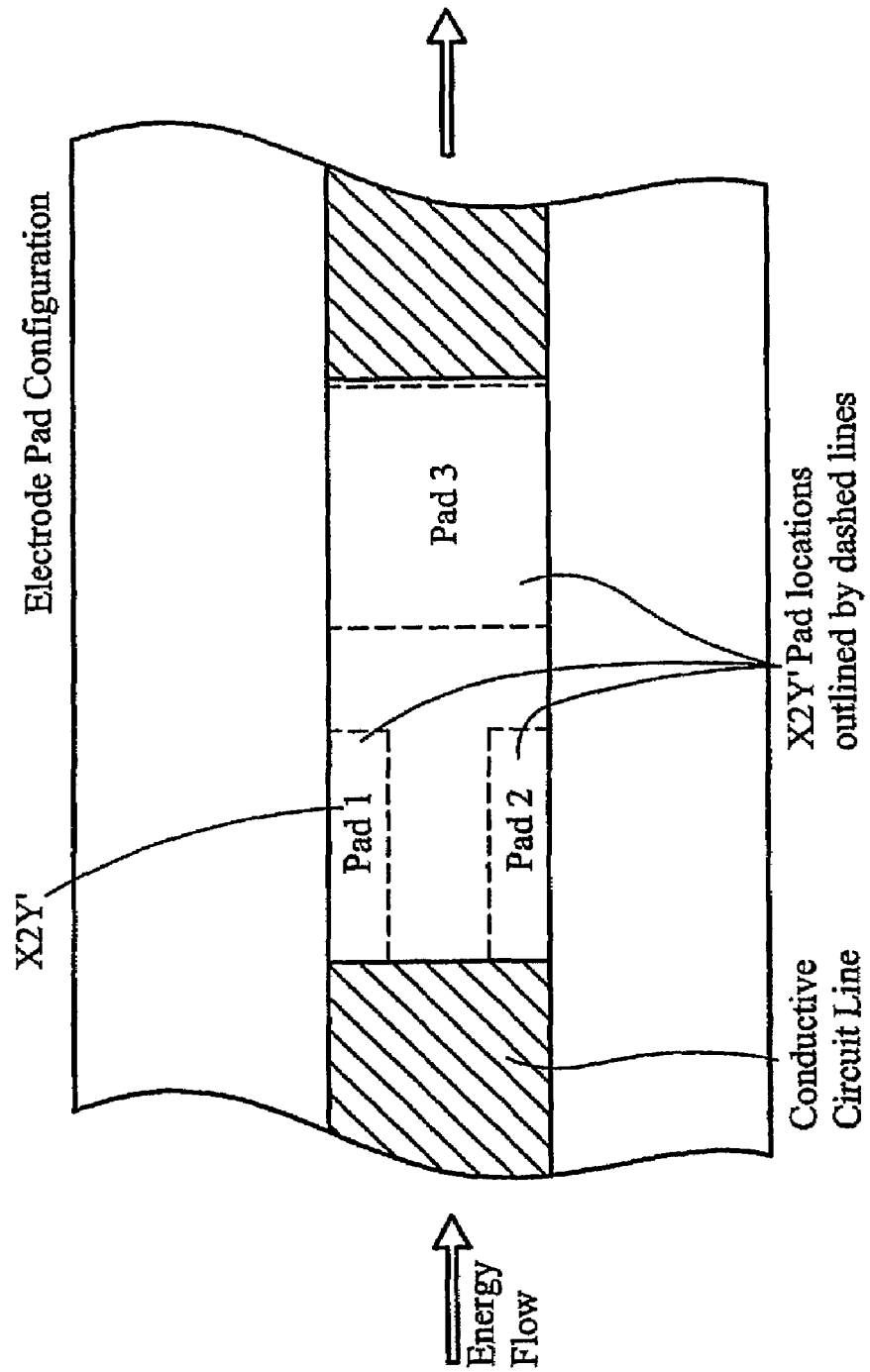

FIG. 27 is a schematic in plan view of a filter arrangement including a variation of the novel energy filter of FIGS. 25A-25C.

DETAILED DESCRIPTION OF THE PREFERRED EMBODIMENTS

Figure 1A:
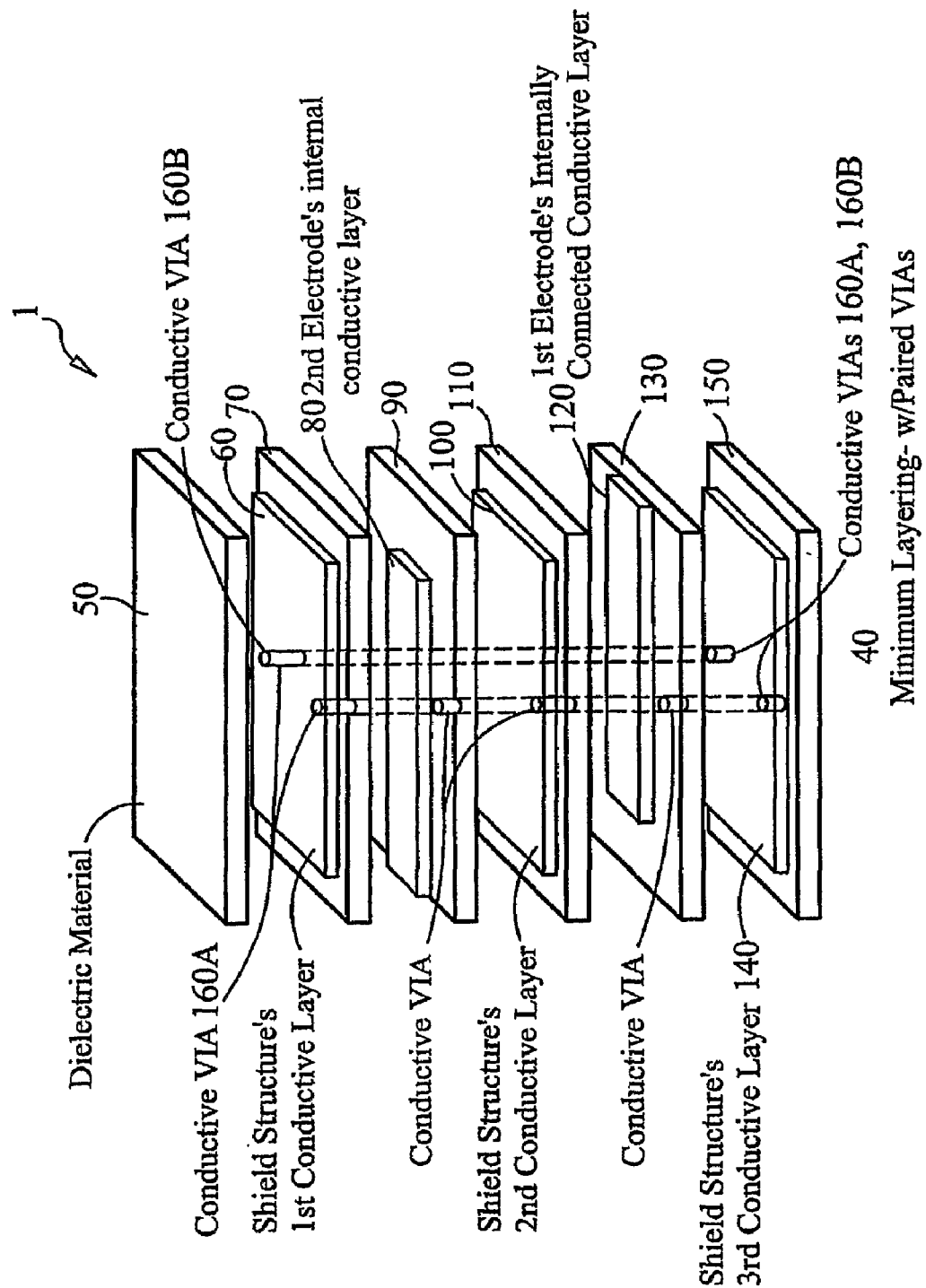
FIG. 1A shows an exploded perspective view of layers of a first embodiment of a novel energy conditioning structure of the invention.
Figure 1B:
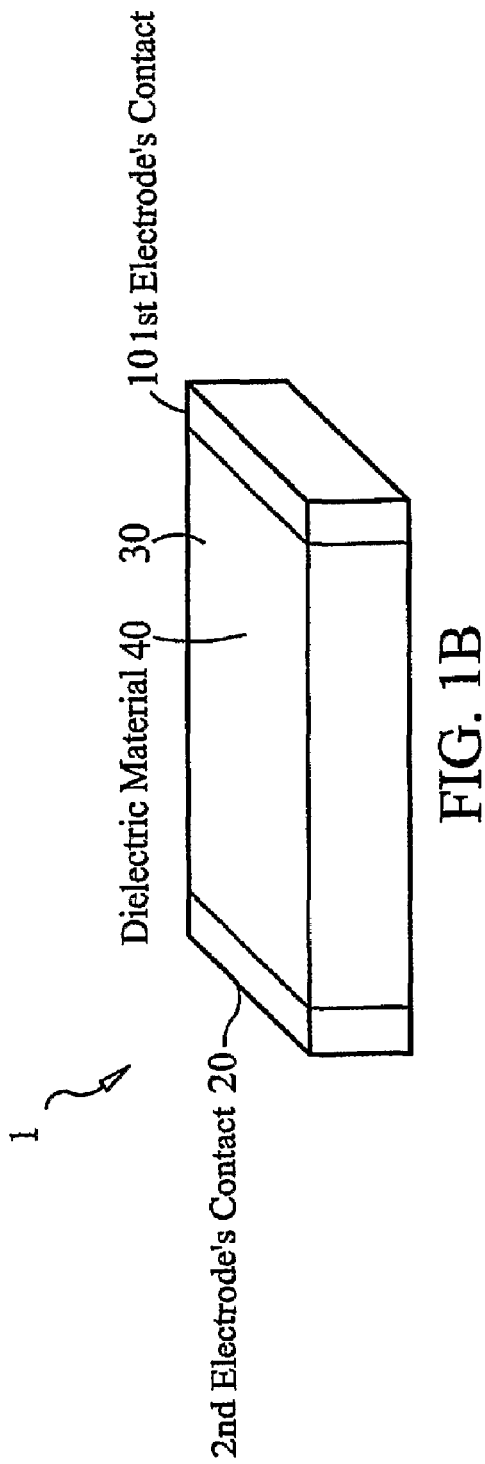
FIG. 1B shows a perspective view of the energy conditioning structure of FIG. 1A.

FIG. 1B shows an energy conditioning structure 1 including a first electrode contact 10, a second electrode contact 20, and a central region 30. The central region 30 has surfaces formed from one or more dielectric materials 40. The surfaces of the first electrode contact, the second electrode contact, and the dielectric material preferably define the entirety of the surface of the energy conditioning structure.

FIG. 1A shows a sequence of layers internal to energy conditioning structure 1. FIG. 1A shows the sequence of layers from top to bottom being dielectric material layer 50, shield structure first conductive layer 60, dielectric material layer 70, second electrode's internal conductive layer 80, dielectric material layer 90, shield structure's second conductive layer 100, dielectric material layer 110, first electrode's internally connected conductive layer 120, dielectric material layer 130, shield structure's third conductive layer 140, and dielectric material layer 150.

FIG. 1A shows conductive pathways extending between layers enabling electrical connection of the shield structure's layers to one another. These pathways are referred to as vias, and FIG. 1A shows vias 160A, 160B. There should be at least one conductive pathway electrically connecting the layers of the shield structure to one anther. Some of these conductive pathways may pass through apertures in the electrodes' internally connected conductive layers, remaining insulated from those layers by a region of dielectric material between the conductive material in the via and the conductive material forming the electrodes' internally connected conductive layers.

Preferably, these conductive pathways 160A, 160B extend along paths outside the planar extent of the electrodes' internally connected conductive layers. Preferably, there are a plurality of conductive pathways like 160A, 160B disposed to ring each one of the electrodes' internal conductive layers. Preferably, there is a sufficient density of conductive pathways like 160A, 160B ringing each one of the electrodes' internal conductive layers and connected to the conductive layers of the shield structure so that the shield structure as a whole provides a Faraday cage type of effect for each internal conductive layer of each electrode. That is, preferably, the shield structure shields electromagnetic field oscillations at relevant frequencies located adjacent each on of the conductive layers of the electrodes from other conductive layers of the conductive electrodes, and shields all of the conductive layers of the electrodes from electromagnetic oscillations originating outside the shield structure.

Figure 1C:
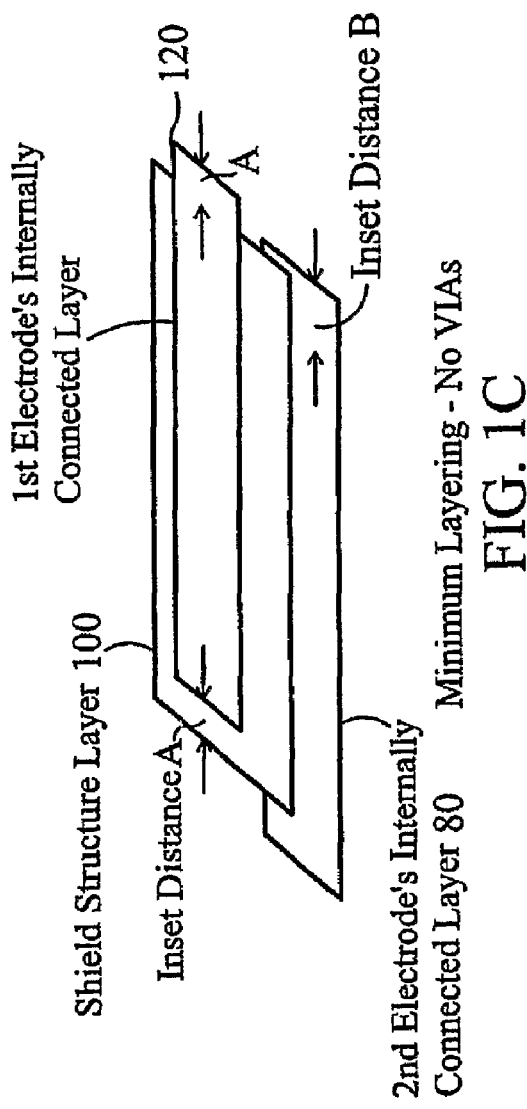
FIG. 1C shows a partial exploded perspective view of some elements of the energy conditioning structure of FIG. illustrating inset distances between certain layers.

FIG. 1C illustrates inset/offset of edges of the internal layers in energy conditioner 1 from one another. FIG shows inset distance "A" of the left side of the first electrode's internally connected layer 120 from shield structure's layer 100, and a similar outset distance "A" of the right side of the first electrode's internally connected layer 120 from the right side end of shield structure's layer 100. Layer 80 is similarly offset, but in the opposite direction, relative to the left and right ends of shield structure's layer 100. The offset of the right side end of layer 120 relative to layer 100 enables layer 120 to internally contact the first electrode's contact 10, without also contacting layer 100 to the first electrode. The offset of the left side of the end of layer 80 relative to layer 100 enables layer 80 to internally contact the second electrode's contact 20 without also contacting layer 100 to the second electrode.

FIGS. 1A-1C show that the shield structure does not contact the first electrode, does not contact the second electrode, and does not have an electrode for contact to a circuit element. FIGS. 1A-1C show the shield structure embedded inside dielectric material so that the surface of energy conditioner 1 does not include any surface of the shield structure.

FIGS. 1A-1C are exemplary in that they show only one conductive layer for each one of electrodes A and B.

In most applications, each energy conditioner 1 would include a set of more than one conductive layer for each electrode.

In some applications, the first electrode and/or the second electrode do not form end caps covering right left (as shown in FIG. 1B) ends of energy conditioner 1. Instead, the electrodes form part of a surface of the energy conditioner on any one of the front, back, left and right sides of the structure.

In some applications, the first electrode and/or the second electrode do not form end caps covering right and/or left (as shown in FIG. 1B ends of energy conditioner 1, and do not form part of the left, right, front, or back (as shown in FIG. 1B) surfaces. Instead, they form part of the top and/or bottom surfaces of energy conditioner 1, and are connected to their respective internally conductive layers via additional vias (not shown) extending through and be insulated from layers of the shield structure and layers connected to other electrodes.

In some applications, each energy conditioner 1 includes more than 2 electrodes. In these embodiments, each electrode contacts at least one conductive layer internal to the energy conditioner, and each such conductive layer has an outset or tab portion extending in the planar direction beyond the extent of the shield structures layers. That tab portion contacts to an electrode having a surface available for electrical contact with other circuit elements. The surface of this electrode may be located on any surface of the energy conditioner; top; bottom front; back; left; or right side.

The FIGS. 1A-1C embodiment shows the shield structure formed from a series of conductive layers which are electrically connected to one another such that each layer of each electrodes is separated from a layer of any other electrode by a layer of the shield structure. Preferably, the shield structure's conductive layers are substantially integral layers. However, regions of the conductive layers of the shield structure may be removed so long as sufficient regions of each conductive layer of the shield structure remain to provide shield structure like device performance, such as decreased internal inductance compared to non-shielded energy conditioner structures. For frequency ranges up to about 10 gigahertz, this requires that the spacing between conductive regions of the same conductive layer of the shield structure be less than one centimeter, preferably less than 5 millimeters, and more preferably less than about one millimeter.

While not preferred, each conductive layer of the shield structure may be replaced by a grid work or mesh or array (regular or irregular) of conductive lines having line separations of no more than one centimeter, and preferably no more than one millimeter, line widths and depths greater than 100 Angstroms, more preferably at least 1000 Angstroms in width, and most preferable at least one micron in width.

Preferably, the insulating spacing or distance between conductors of any electrode and the conductor forming the shield structure is at least 100 Angstroms, preferably at least 1000 Angstroms, more preferably still at least 1 micron, and most preferably at least 100 microns.

The minimum spacing is defined in part by the dielectric constant, dielectric strength, and voltage fluctuations of the intended use of the energy conditioner Thus, the FIG. 1A-1B embodiment is exemplary of only one simplified version of the energy conditioner of the invention.

Figure 2A:
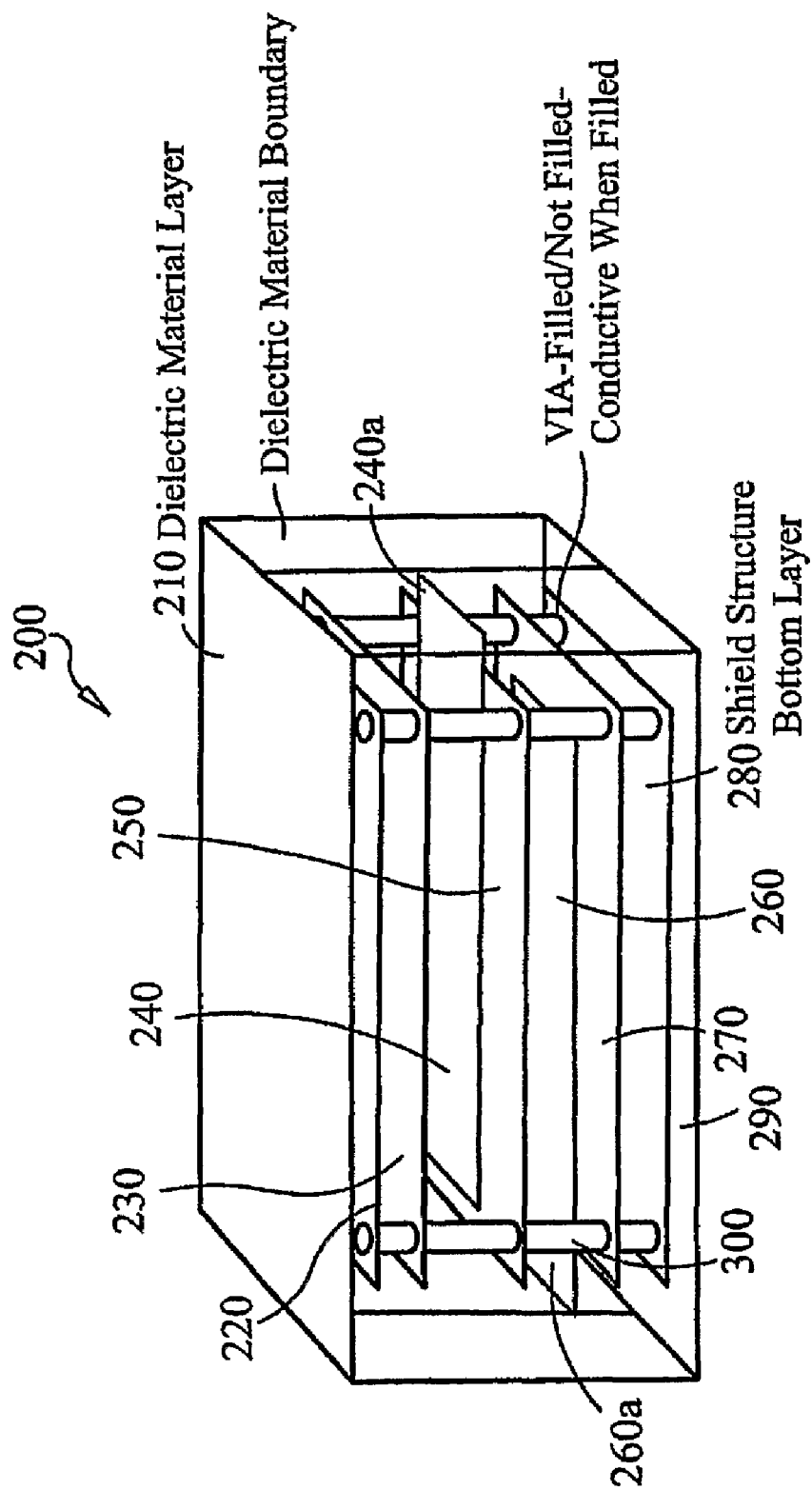
FIG. 2A is an exploded perspective view of layers of a second embodiment of a novel energy conditioning structure of the invention.

FIG. 2A shows a sequence of layers of energy conditioner 200 from top to bottom as dielectric material top layer 210, conductive outer top shield structure layer 220, conductive inner top shield structure layer 230, conductive first electrode layer 240, conductive middle shield structure layer 250, conductive second electrode layer 260, conductive inner bottom shield layer 270, conductive outer bottom shield layer 280, and dielectric material bottom layer Not shown are dielectric layers between each pair of adjacent conductive layers. In plan view, each shield structure layer extends beyond three sides of each electrode layer. In plan view, electrode layer 240 has portion 240a extending beyond the shield structure's layers, and electrode layer 260 has portion 260a extending beyond the shield structure's layers. The portions 260a and 240a are on opposite ends of energy conditioner 200. Structure 200 differs from structure 1 in the existence of the adjacent top shield structure layers 220,230, which are only separated from one another by dielectric. Structure 200 differs from structure 1 in the existence of the adjacent bottom shield structure layers 270, which are only separated from one another by dielectric.

FIG. 2A. also shows via structures 300 traversing the shield structure layers 230,250, 270. The vias also traverse the intervening dielectric layers, which are not shown. Vias 300 do not traverse the dielectric material layers 200 or 290.

Figure 2B:
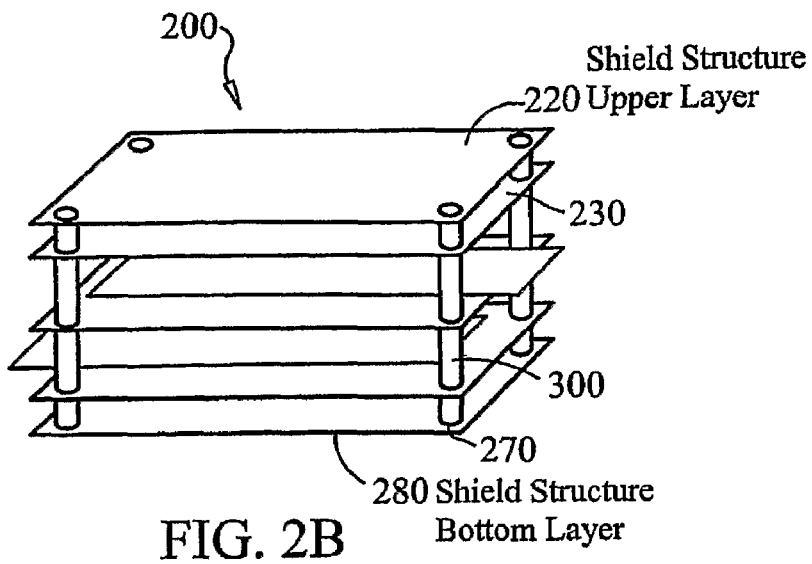
FIG. 2B is an exploded perspective view of layers of a second embodiment of a novel energy conditioning structure of the invention excluding upper and lower dielectric layers.

FIG. 2B shows the layers without the top and bottom dielectric material layers.

Figure 2C:
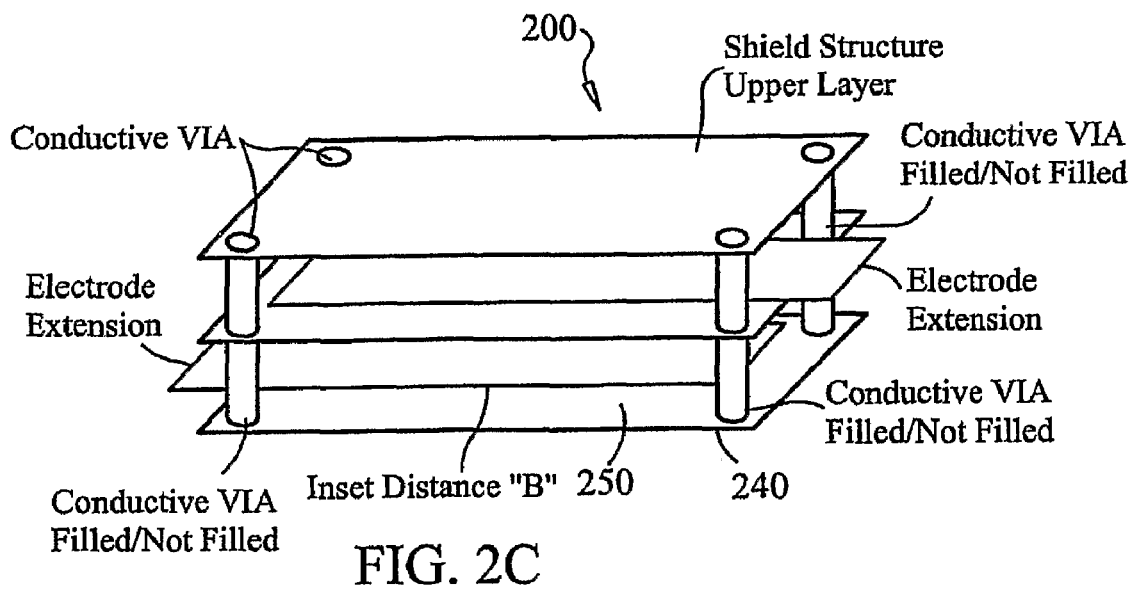
FIG. 2C is an exploded perspective view of layers of a second embodiment of a novel energy conditioning structure of the invention excluding upper and lower dielectric layers and excluding upper and lower shield structure layers.

FIG. 2C shows the layers without the top and bottom dielectric material layers and without the top and outer two shield layers 220,280. FIG. 2C shows the inset distance B which is the distance, in a plan view, that shield structure layer 250 extends beyond an edge of electrode layer 240.

Energy conditioner 200 includes electrode contacts like electrode contacts 10,20 of energy conditioner 1, which are not shown in FIGS. 2A-2C.

In one alternative embodiment, outer shield layers 220,280 are not electrically connected to the other layers of the shield structure, and outer shield layers are each individually electrically isolated.

In another alternative embodiment, outer shield layers 220, 208 are not electrically connected to the other layers of the shield structure, and outer shield layers are each electrically connected to one another via additional vias.

In another alternative embodiment, the layered structure including the shield structure or structures shown in FIGS. 1A-2C are embedded in a monolithic layered structure comprising either a PC board, an interposer, or a semiconductor chip. In these embodiments there may be no electrode contact surface. Instead, there may be an extension of at least one conductive layer of each electrode beyond the planar extent of the cage like shield structures such that the each electrode connects to a line of a circuit.

Various relationships between portions of circuits and the energy conditioners of the invention are shown in FIGS. 2-12. These figures illustrate novel geometric inter-relationships between energy conditioners and circuit elements which are within the scope of this invention.

Hereinafter, energy conditioners of the invention will be referred to as X2Y'.

Figure 3A:
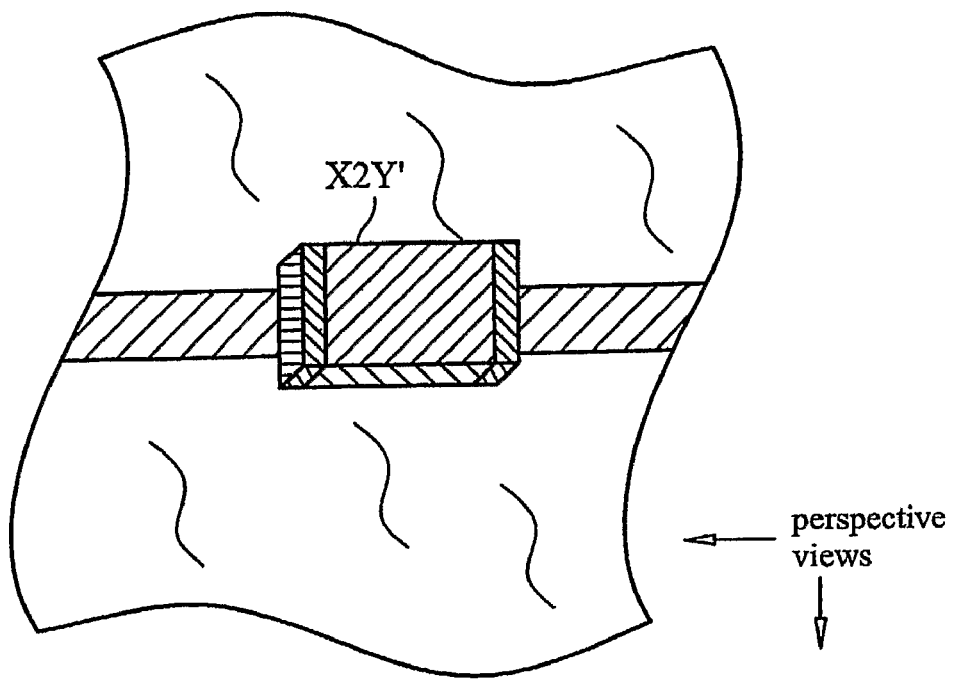
FIG. 3A shows a filter arrangement including an energy conditioner disposed on surface including a conductive line.

FIG. 3A shows an X2Y' having its end cap electrodes disposed longitudinally along a conductive line of a circuit. Both end caps are electrically connected to the conductive line of the circuit.

Figure 3B:
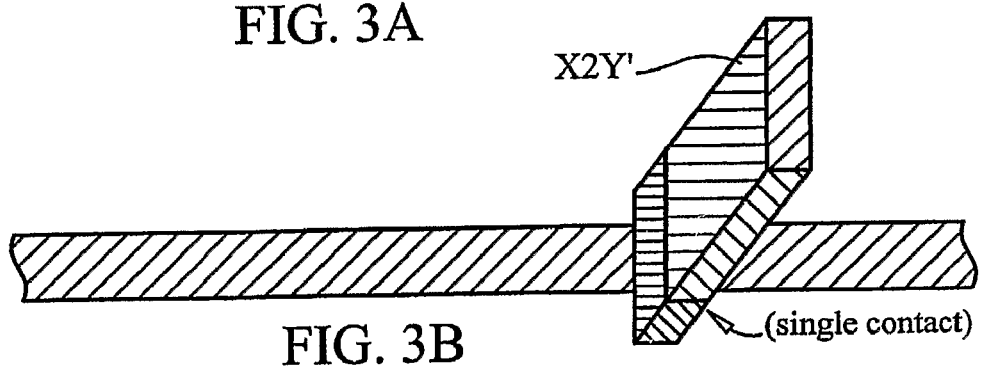
FIG. 3B shows a filter arrangement including an energy conditioner disposed on a conductive line and having only a single electrode connected.

FIG. 3B shows an energy conditioner X2Y' having one electrode end in contact with a conductive line of a circuit, an no other electrodes contacting the circuit. In this embodiment, the X2Y' energy conditioner does not require a second electrode contact. Therefore, it may be manufactured with or without the surface contact portion of the second electrode.

Figure 3C:
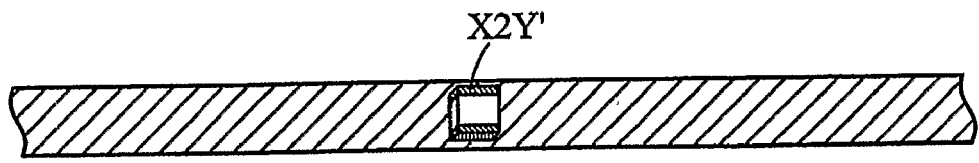
FIG. 3C shows a filter arrangement including an energy conditioner disposed on a conductive line.

FIG. 3C show an X2Y' having dimension less than the width of the conductive line, and its electrode end caps oriented transverse to the direction of extension of the conductive line of a circuit.

Figure 3D:
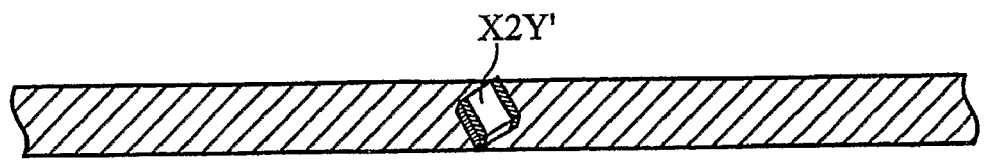
FIG. 3D shows a filter arrangement including an energy conditioner disposed on a conductive line.

FIG. 3D show an X2Y' having dimension less than the width of the conductive line, and its electrode end caps oriented at an angle that is between transverse and longitudinal relative to the direction of extension of the conductive line of a circuit.

Figure 4A:
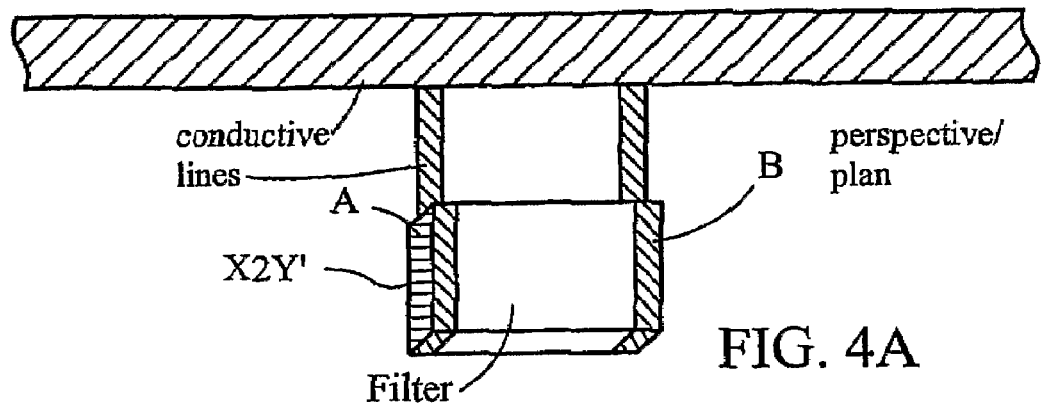
FIG. 4A shows a filter arrangement including an energy conditioner circuit with A and B electrode contacts connected to separate conductive lines.

FIG. 4A shows an X2Y' having each one of its electrode end caps connected to a different one of two side lines that each in turn connect to a different point along a conductive line of a circuit. Alternatively, the two side lines could connect to the same point along the conductive line of the circuit.

Figure 4B:
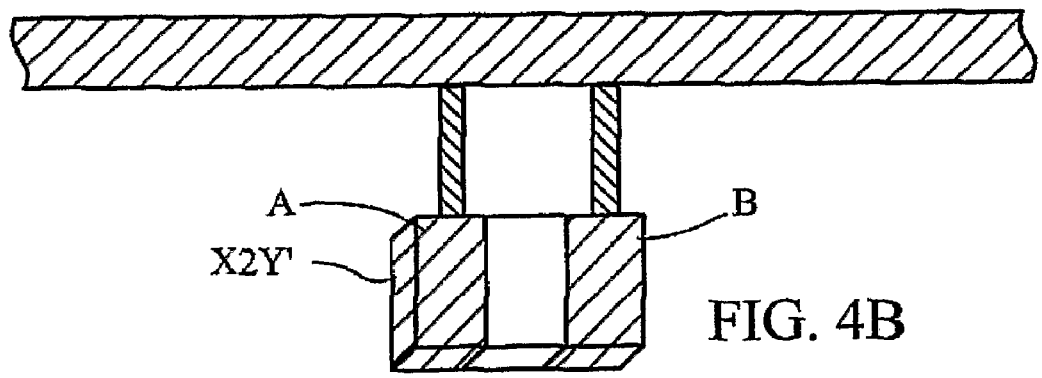
FIG. 4B shows a filter arrangement including an energy conditioner circuit having another an energy conditioner with different geometric ratios of A and B electrode contacts connected to separate conductive lines.

FIG. 4B shows an alternative to FIG. 4A wherein the length of each end cap of each electrode of the X2Y' is greater than the width of each side line.

Figure 5A:
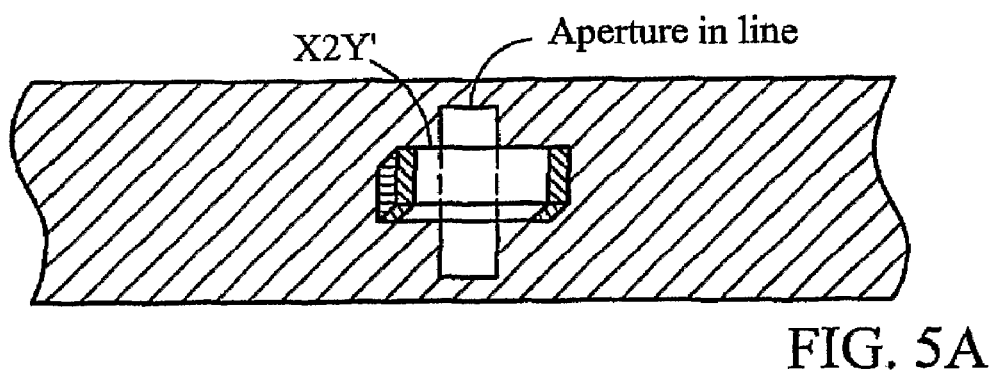
FIG. 5A shows a filter arrangement including an energy conditioner disposed transversely on a conductive line over an aperture in the line.

FIG. 5A shows a conductive line of a circuits having an aperture upon which an X2Y' is disposed. The X2Y' contacts the line of the circuit on opposite sides of the aperture and the end caps of the X2Y' are oriented along the longitudinal direction of the line of the circuit.

Figure 5B:
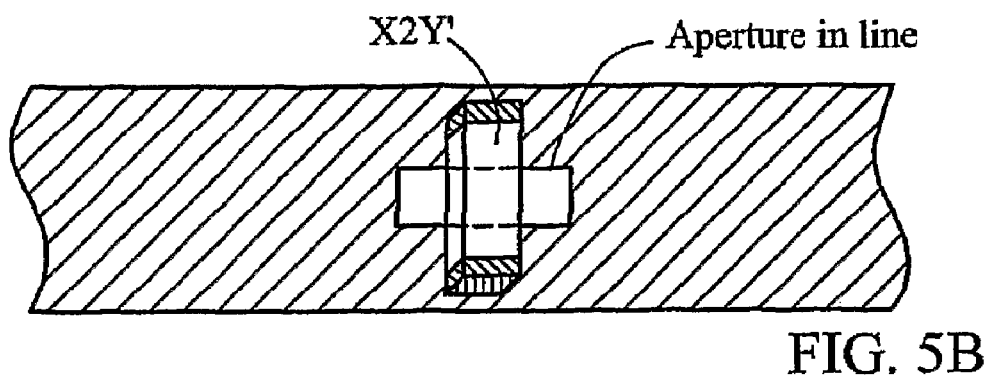
FIG. 5B shows a filter arrangement including an energy conditioner disposed longitudinally on a conductive line over an aperture in the line.

FIG. 5B show and a conductive line with an aperture and an X2Y' transversely over the aperture such that the X2Y' end caps are along the same point along the length of the line of the circuit.

Figure 6:
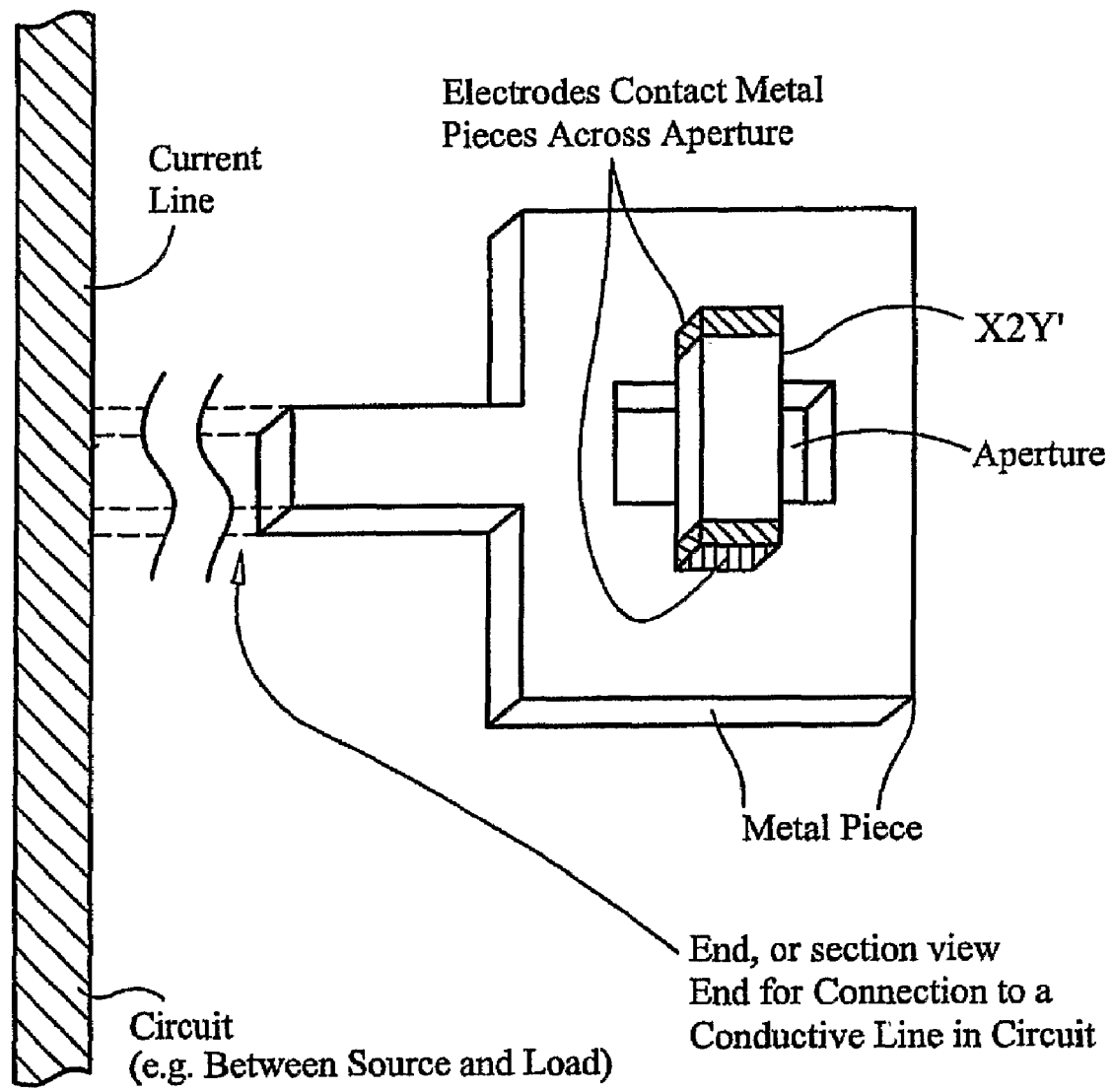
FIG. 6 is a perspective view that shows a filter arrangement including in perspective view including an energy conditioner disposed over an aperture in a rectangular conductive component.

FIG. 6 shows an square shaped metal piece having an aperture and a connection arm, and an X2Y' disposed over the aperture such that the end caps of the X2Y's are in electrical contact with opposite sides of the metal piece. In alternative embodiments the metal piece is oblong, annular, or rectangular, and the X2Y' is oriented at various angles relative to the extension of the arm to provide suitable phase cancellation. The arm connects to a line of a circuit, to provide energy conditioning. Alternatively, the X2Y' may fit into a seat or recess in the aperture, or may span a length of the aperture and fit into the aperture and contact opposite surfaces of aperture.

Figure 7:
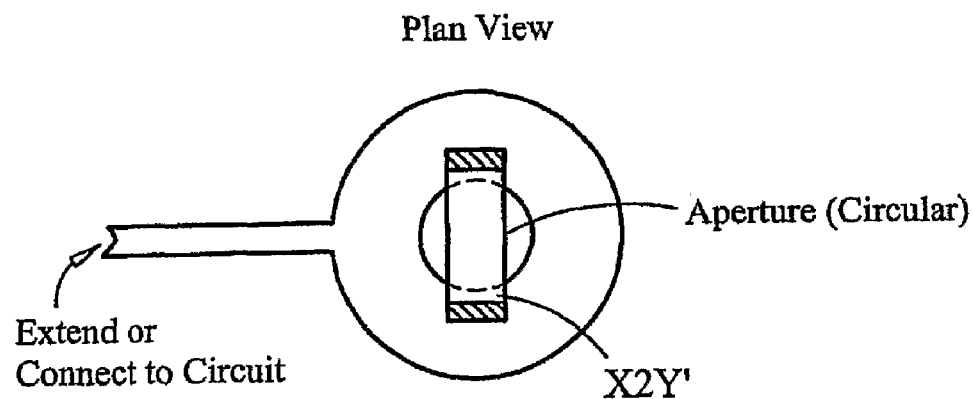
FIG. 7 is a plan view that shows a filter arrangement including a energy conditioner disposed over a circular aperture in a conductive ring shaped component.
Figure 8:
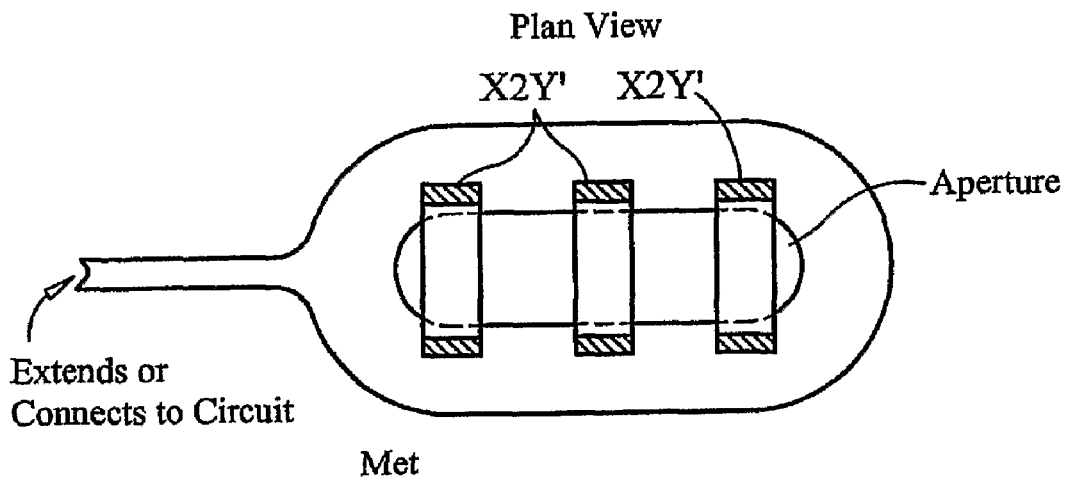
FIG. 8 is a plan view that shows a filter arrangement including three energy conditioners disposed across an aperture in an elongate generally elliptically shaped conductive piece.

FIGS. 7 and 8 show alternative annular shapes and multiple X2Y' filters similar to FIG. 6.

Figure 9:
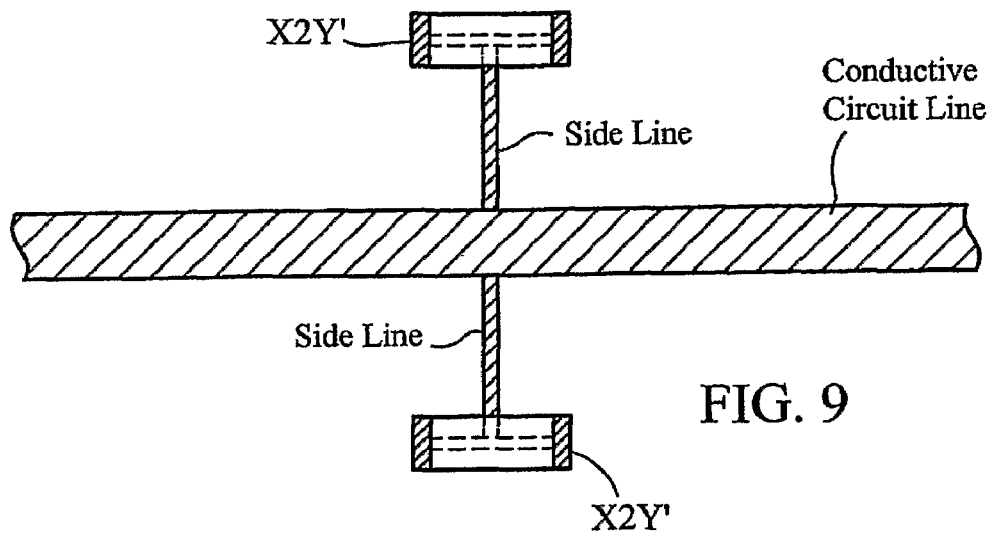
FIG. 9 is a plan view of a filter arrangement including two energy conditioners symmetrically arranged off opposite sides of a conductive circuit line.

FIG. 9 shows a filter arrangement in which side lines extend symmetrically from a circuit line, each side line contacting one or more terminals of an X2Y'. Preferably, each side line forms a pad upon which the X2Y' resides such that both end caps of the X2Y' connect and electrically connect to the pad.

Figure 10:
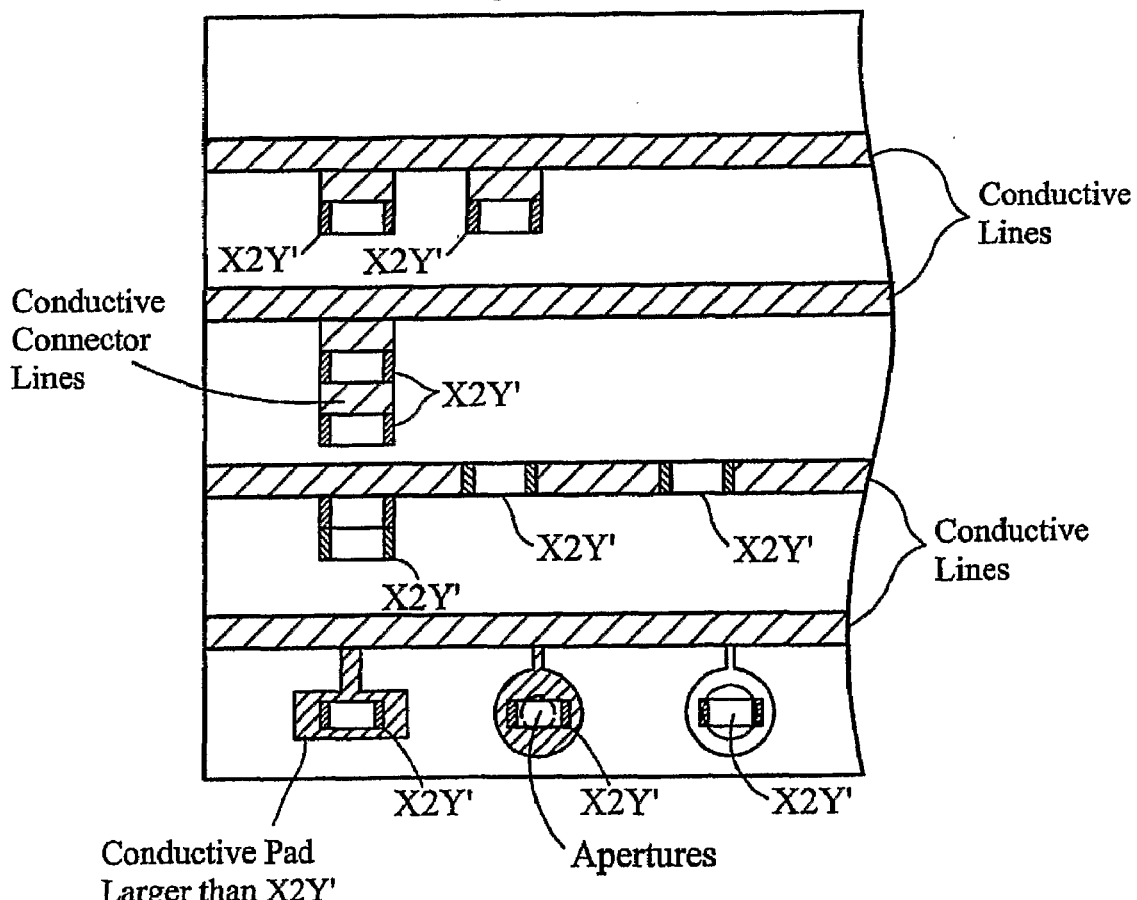
FIG. 10 is a plan view of a circuit portion including a plurality of conductive lines and various arrangements of energy conditioners on and near the lines conditioning energy for each line.

FIG. 10 shows portions of four circuit lines on a substrate, such as is often found in digital electronics on semiconductor chips, PC boards, and other substrates. FIG. 10 also shows various filter arrangements incorporating X2Y's connected to the various circuit lines.

Figure 11:
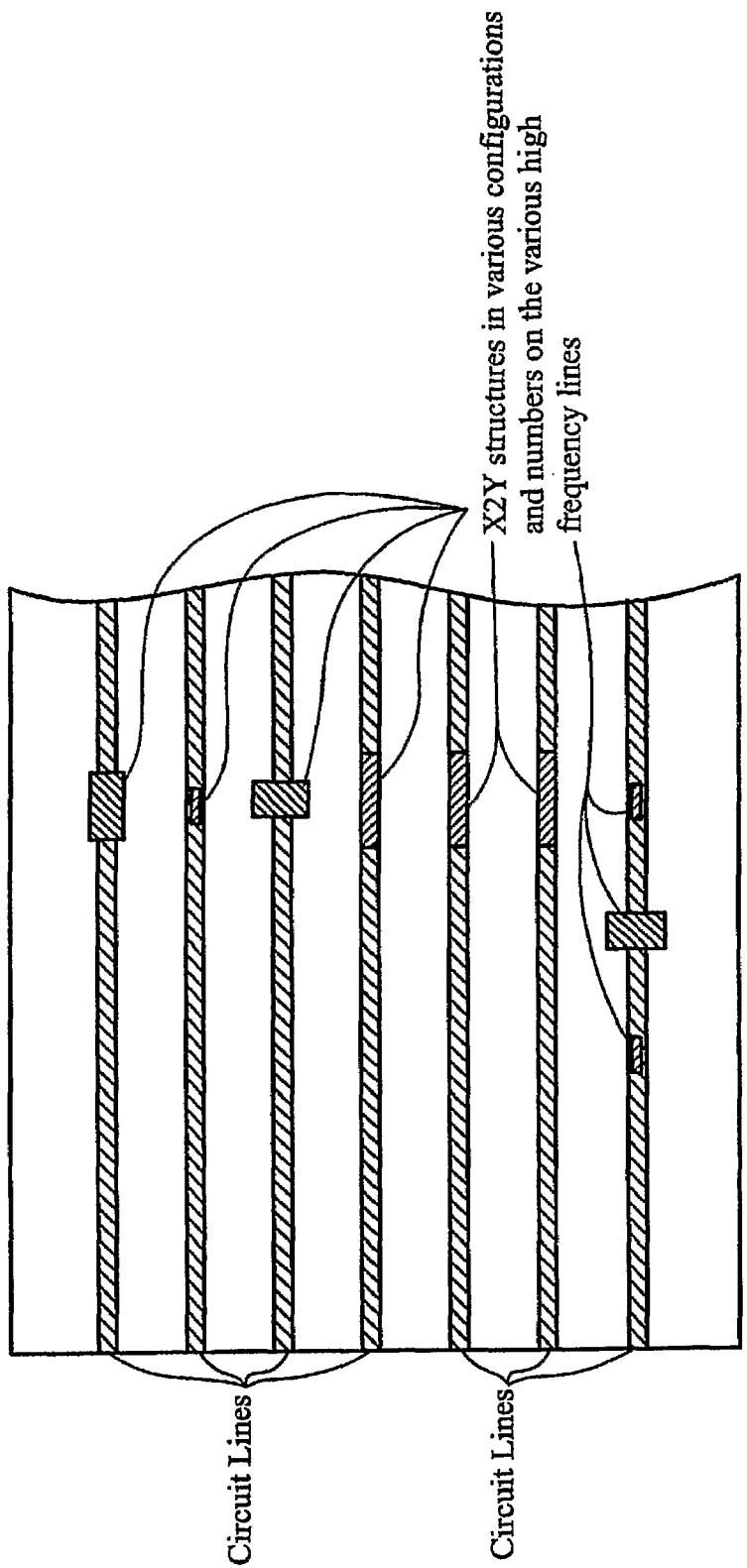
FIG. 11 is a plan view of a circuit portion including a plurality of conductive lines and various arrangements of energy conditioners disposed on the lines conditioning energy for each line.

FIG. 11 show another arrangement of circuit lines on a substrate along with one or more X2Y's in various orientations on each circuit line.

Figure 12:
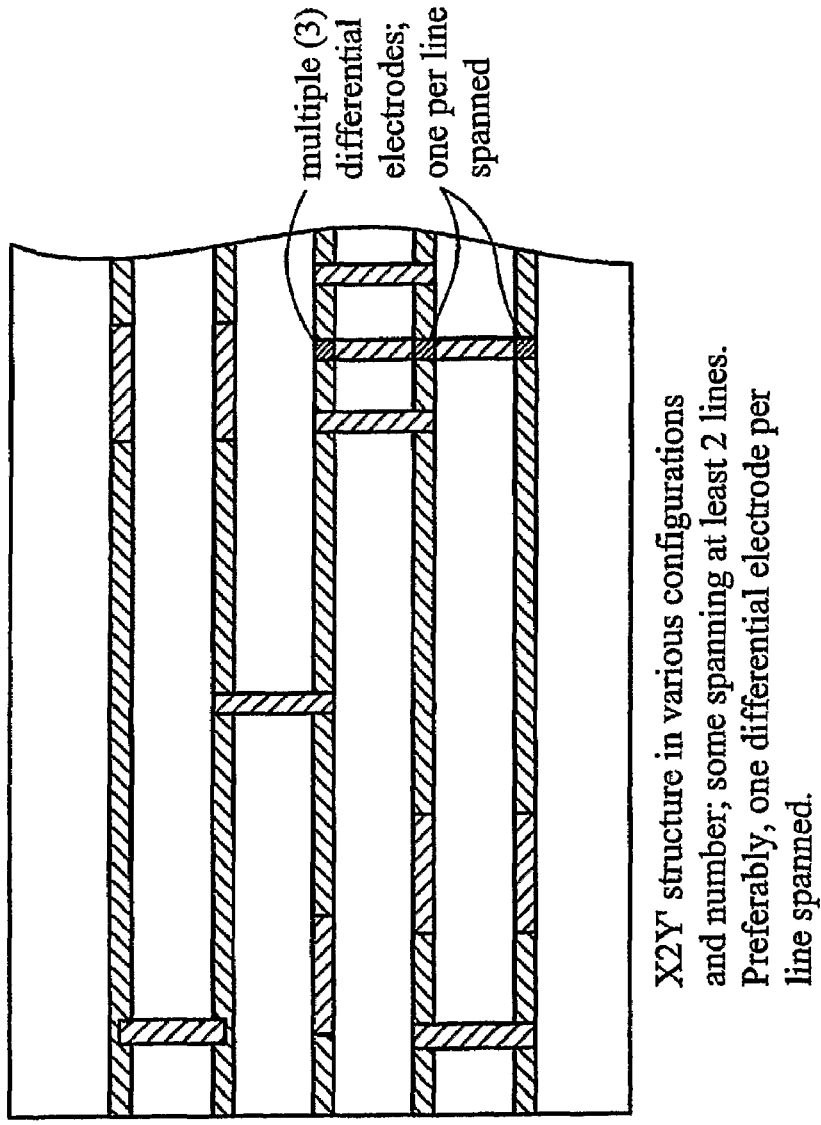
FIG. 12 is a plan view of a circuit portion including a plurality of conductive lines and various arrangements of energy conditioners disposed on the lines in which each energy conditioner connects to one or more lines.

FIG. 12 is similar to FIGS. 10 and 11. However, FIG. 12 shows some X2Y's spanning two circuit lines such that the spanning X2Y' has one electrode connected to one circuit line and the other electrode connected to the other circuit line. FIG. 12 also shows X2Y' element C having three electrodes, with one electrode connected to each one of three lines. Alternatively, an X2Y' structure (a structure with an internally floating shield structure), could have more than three electrodes, for example, one electrode for each parallel circuit line. In bus architectures this would enable a single X2Y' devise to span a series of bus lines and condition the energy along all of those lines. Such a multi electrode X2Y' device could be disposed as shown in FIG. 12 perpendicular to the extension of the wire lines. Alternatively, the multi electrode X2Y' could be disposed at an angle other than a right angle relative to the extension of the parallel circuit lines as required to register each X2Y' electrode onto each bus line.

Figure 13A:
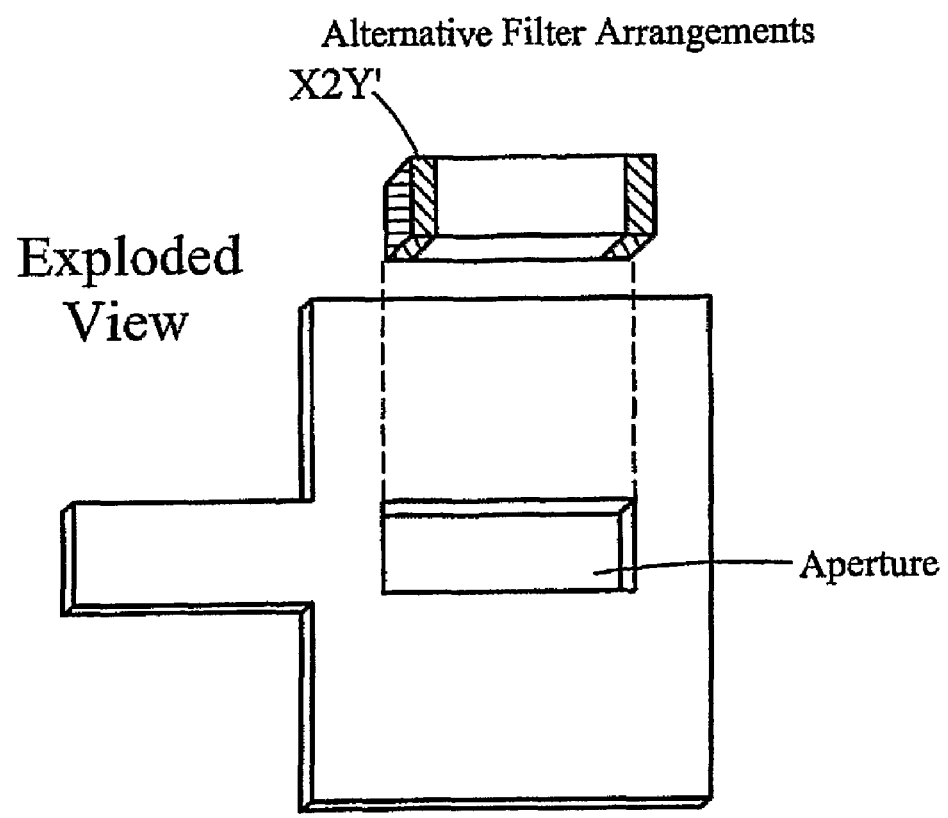
FIG. 13A is an exploded perspective view of an filter arrangement including an energy conditioner configured to fit into and span an aperture in a ring formed of conductive material.
Figure 13B:
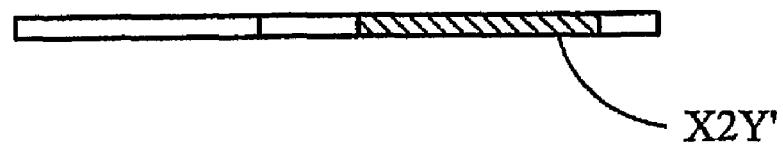
FIG. 13B is a side view of the filter arrangement of FIG. 13A.

FIG. 13a shows an X2Y' and apertured conductive piece designed such that the X2Y' has the same dimension as the aperture and can fit into the aperture as shown in FIG. 13B.

Figure 14:
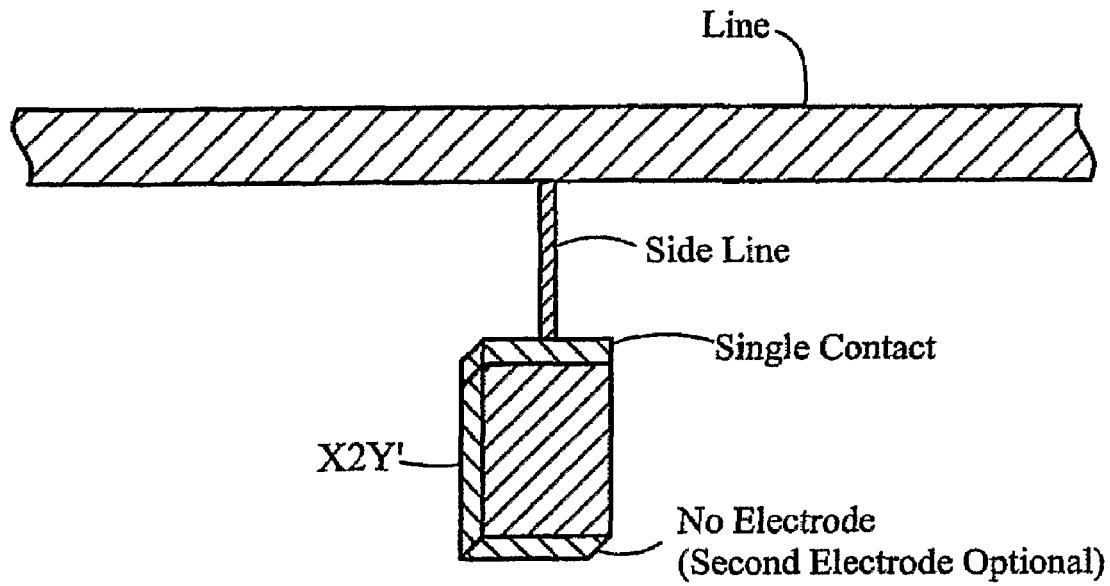
FIG. 14 is a schematic view of a filter arrangement including an energy conditioner having a single electrode connected.

FIG. 14 sows a circuit line with a side line projecting therefrom and connecting to one electrode of an X2Y'. Since no other electrode of the X2Y's is required, the other external electrode for the X2Y' need not be fabricated.

Figure 15:
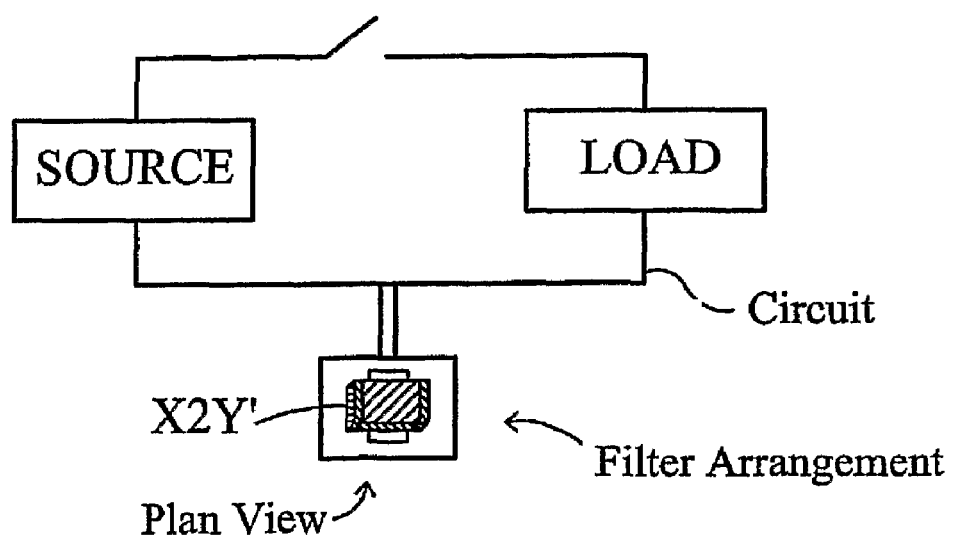
FIG. 15 is a schematic of a complete circuit including a filter arrangement including energy conditioner spanning an aperture in a conductive loop.

FIG. 15 shows a filter arrangement previously discussed connected to a complete circuit.

Figure 16:
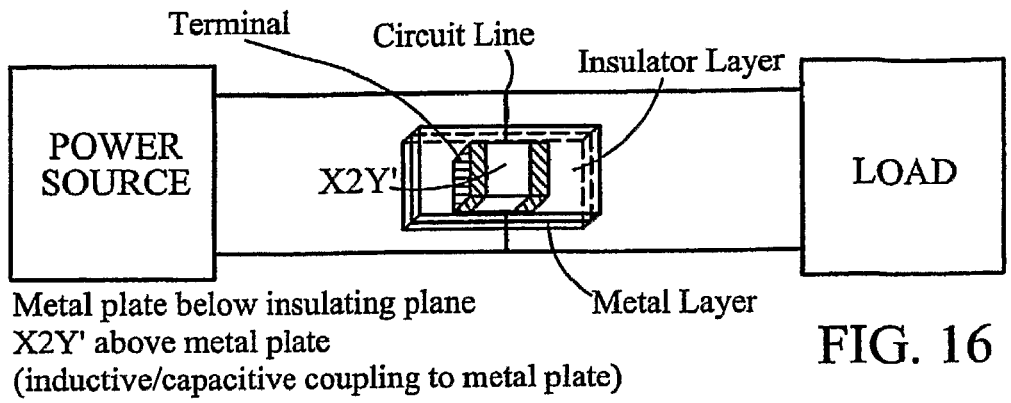
FIG. 16 is a schematic view of a complete circuit including an energy conditioner and a metal layer capacitively and inductively coupled and conductively isolated from the energy conditioner.

FIG. 16 shows a complete circuit with an X2Y' across the source and the load. In addition, FIG. 16 shows a metal layer of specified dimensions insulatively spaces by a specified distance from a surface of the X2Y'. The size, shape, and spacing of the metal layer from the X2Y' and other components affects capacitive and inductive coupling to the metal layer. Therefore, the size, shape, and spacing of the metal layer from the X2Y' and other components of the circuit provide for frequency and phase tuning of energy conditioning provided by the X2Y'.

Figure 17:
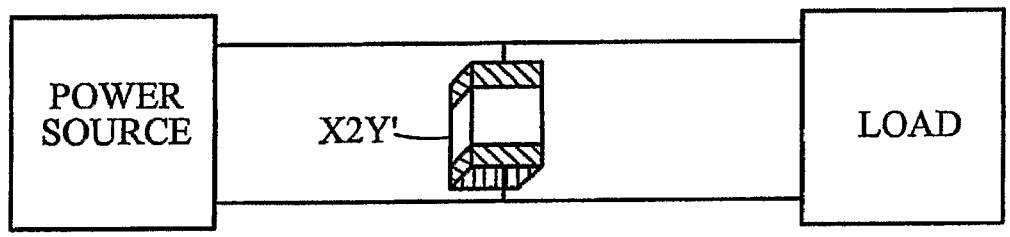
FIG. 17 is a schematic of a complete circuit including an energy conditioner connected across the source and the load.

FIG. 17 shows a complete circuit with and X2Y' having its two electrodes across the load.

Figure 18:
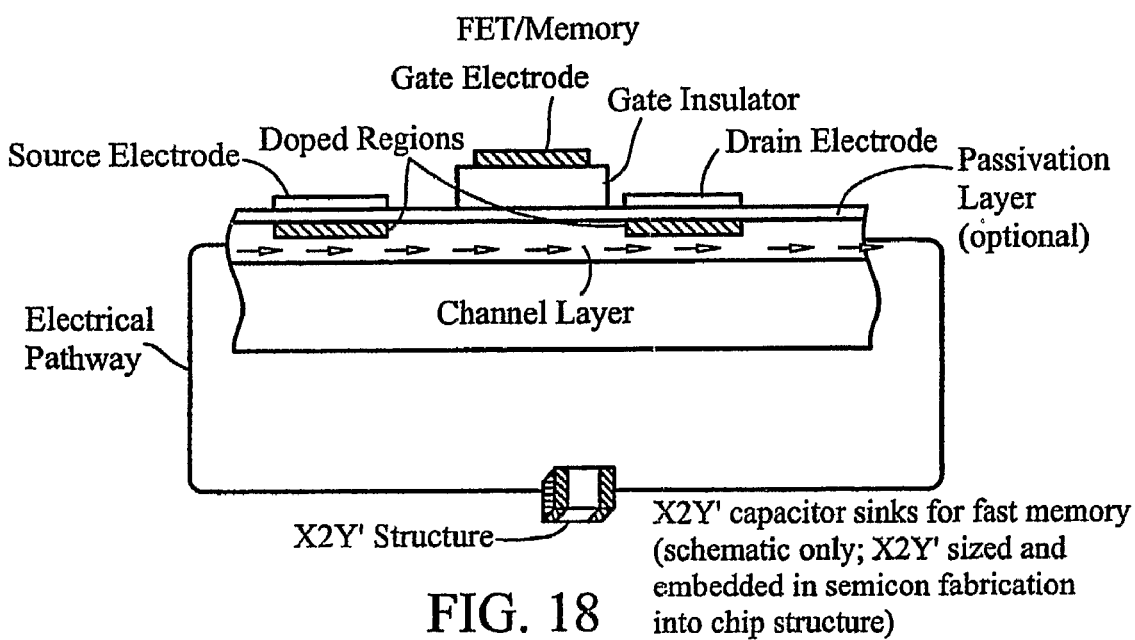
FIG. 18 is a schematic of an energy conditioner connected across the source and drain electrodes of a Field Effect Transistor (FET)

FIGS. 18-20 schematically illustrate application of X2Y' structures to FETs and FET based memory. FET meaning Field Effect Transistor. However, the circuit disclosed are equally applicable to bipolar transistors.

FIG. 18 represents an X2Y' connected across the source and drain of a FET to provide for example, filtering of high frequency components in the source drain voltage.

Figure 19A:
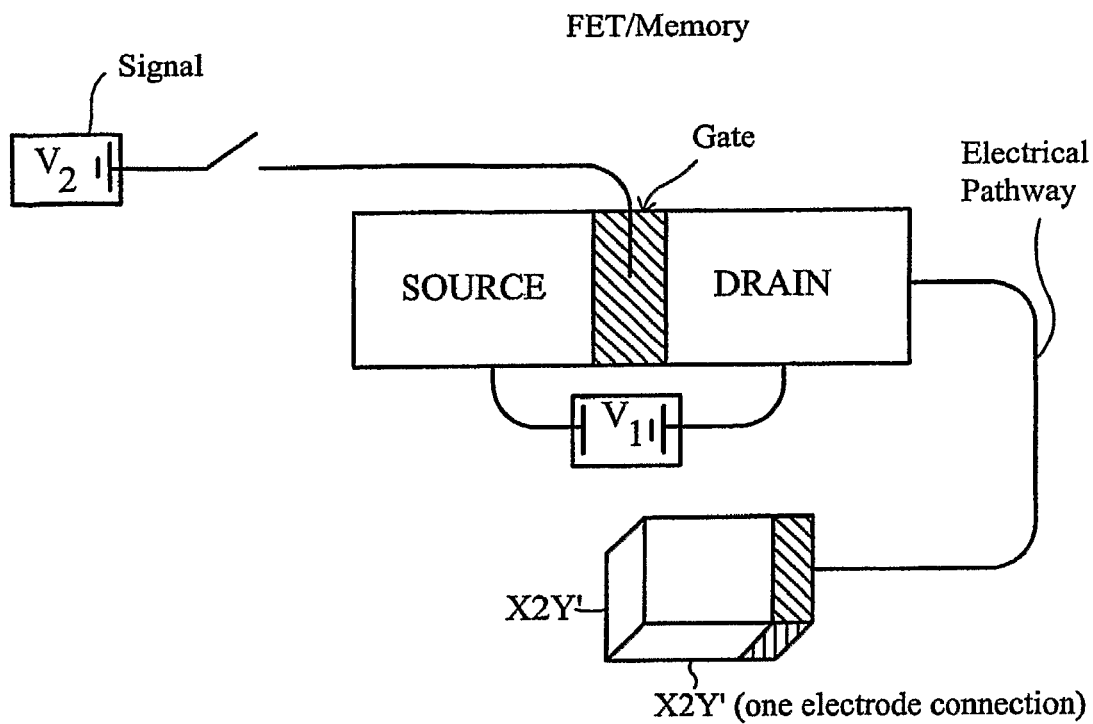
FIG. 19A is a schematic of an energy conditioner having one electrode connected to source or drain of a FET and no other connections to provide a fast charge storage for memory.
Figure 19B:
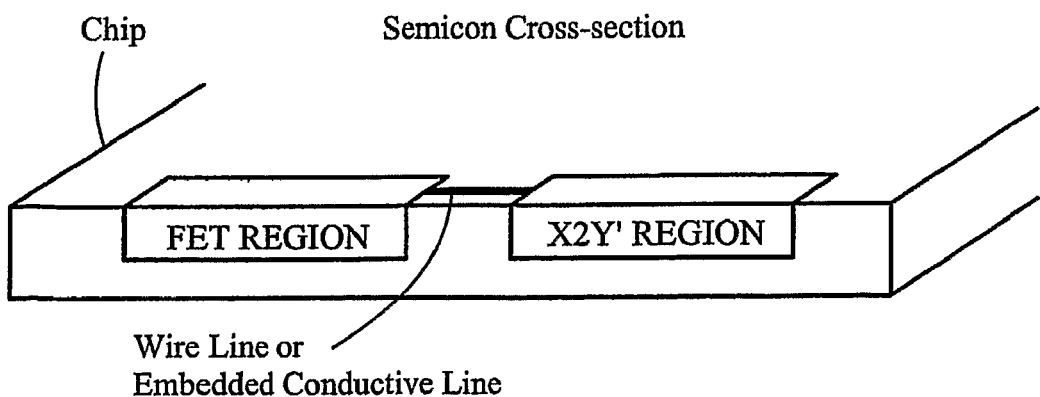
FIG. 19B is a schematic sectional view of a semiconductor wafer showing in high level connection of the energy conditioner to the FET of FIG. 19A.

FIG. 19A shows an X2Y's having one electrode connected to the drain (or to the source) of a FET. This allows capacitive charging of X2Y's's electrodes. X2Y's have very small internal inductance. Therefore, charging time is fast, enabling fast read or write memory of a voltage or charge state. FIG. 19B shows one possible architecture for incorporating the X2Y' structure and a FET structure into a semiconductor chip, in which a conductive line disposed on the surface of the FET's source or drain to a point contacting en electrode layer of the X2Y'.

Figure 20A:
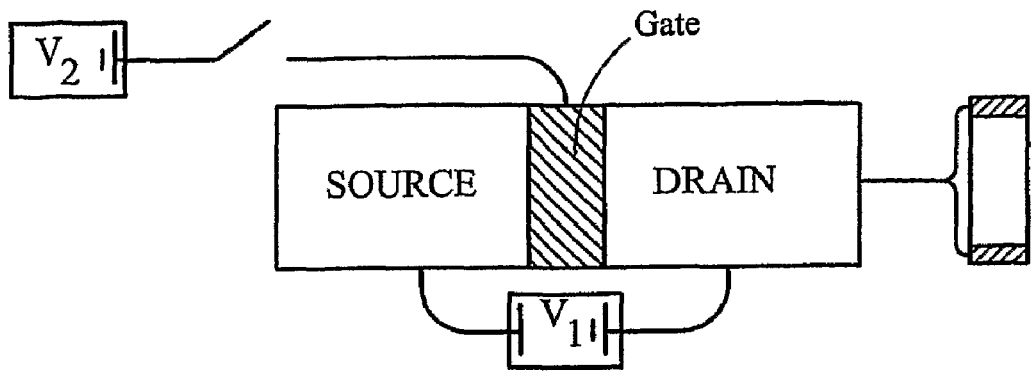
FIG. 20A is a schematic of an energy conditioner having both electrodes connected to source or drain of a FET and no other connections to provide a fast charge storage for memory.
Figure 20B:
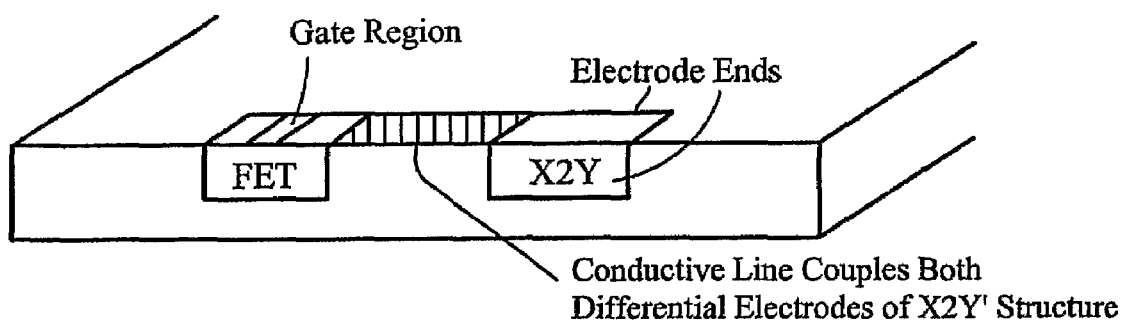
FIG. 20B is a schematic sectional view of a semiconductor wafer showing in high level connection of both terminals of the energy conditioner to the FET of FIG. 20A.

FIGS. 20A and 20B are analogs of FIGS. 19A and 19B showing bulk (A) and integrated (B) formation of a memory having connection to both electrodes of an X2Y'.

Figure 21:
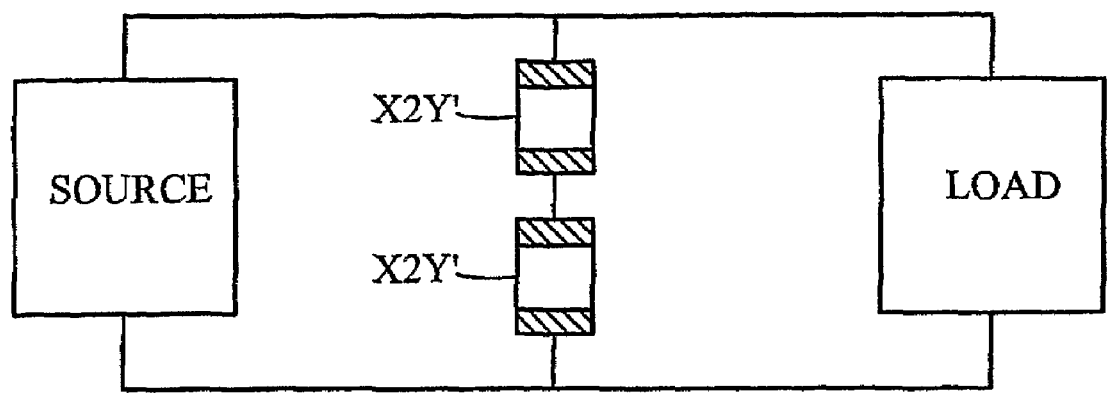
FIGS. 21 and 22 are schematics illustrating complete circuits with various filter arrangements including energy conditioners of the invention.

FIG. 21 shows a complete circuit in which a series of two X2Y's are disposed across the load. Additional X2Y's (3, 4, 5, etc) can be added to the series.

Figure 22:
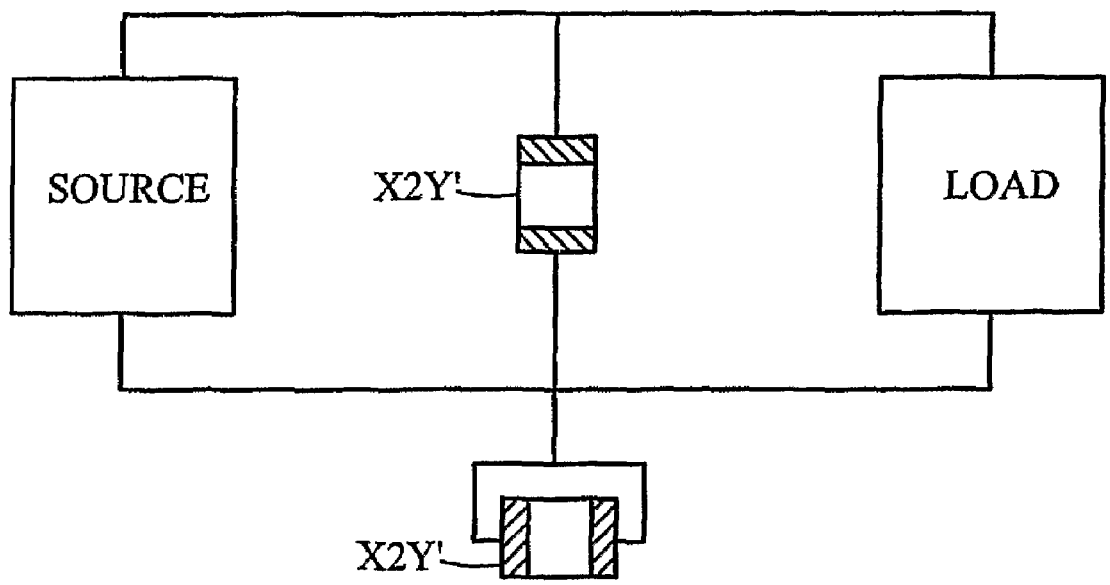

FIG. 22 shows a complete circuit in which an X2Y' is disposed across the load and another X2Y' is disposed connected to a side line, to provide energy conditioning at both extreme ends of the frequency spectrum.

FIG. 23A shows a filter arrangement portion of a circuit including another novel energy conditioner (X2Y') of the invention. The X2Y' of FIG. 23A is a the same as any of the energy conditioners disclosed herein above except that it includes a conductive shell enclosing the A and B electrode structures, the ground shield structure, and the dielectric material. Thus, the FIG. 23A X2Y' includes a floating isolated internal shield structure, an A electrode conductively connected to the conductive shell, and a B electrode structure also conductively connected to the conductive shell. As shown in the filter arrangement of FIG. 23A, this X2Y' is disposed on and in conductive contact with a circuit line. The longer side of the X2Y' is parallel to the circuit line.

FIG. 23C shows the X2Y' of FIG. 23A alternatively arranged so that a shorter side is parallel to the circuit line.

FIG. 23B illustrates an alternative filter arrangement including the X2Y' of FIG. 23A in which the conductive shell of the X2Y' forms the connection between to terminals of a circuit line.

FIG. 24 shows a circuit arrangement including another novel X2Y' energy conditioner. The X2Y' energy conditioner is internally structurally the same as any of the previously disclosed X2Y' structures. However, it includes externally symmetrically placed conductive connections of the right and left side electrode terminal contacts. The filter arrangement in FIG. 24 shows circuit line portions terminating, and the X2Y' externally symmetrically placed conductive connections completing the conductive path of the circuit line portions. Alternatively, the circuit line may have no break, and this X2Y' structure may be disposed on the circuit line in the same configuration shown in FIG. 24, or in the alternative orientation shown in FIG. 23C. In either orientation, the X2Y's internal electrode structures are both electrically connected to the circuit line path on both sides of the X2Y'.

FIG. 25A-25C illustrate another novel energy conditioning structure designed for coupling without electrically contacting a circuit line.

FIG. 25A shows a side view of this novel X2Y' structure and schematically illustrates the internal location of capacitive/inductive coupling pads for two electrodes of this X2Y'.

FIG. 25B shows a side section of the X2Y' of FIG. 25A including an optional metallic casing on all sides except the bottom side, an A electrode pad recessed from the bottom, a B electrode pad recessed from the bottom, an A electrode plate, a B electrode plate, and shield three structure layers such that two layers of the shield structure sandwich each layer or plate of the A and B electrodes. Dielectric material exists between the conductive layers to fix them in position relative to one another. Preferably, there is a dielectric layer of a well defined and uniform thickness below the A and B electrode pads. As in all previous embodiments, the shield structure electrically floats in potential. Different from all previous embodiments, the A electrode and the B electrode also float; they do not electrically contact any line of a circuit. Preferably, the lower surface is material that will wet with a conductive metal such as conventional solder, indium or indium-tin. In use, the bottom surface of the X2Y may be soldered using these metals to a conductive line of a circuit. Use of a metal solder connection enables the dielectric spacing defined by the thickness of the dielectric layer below the electrode pads to define distance between the metal of the circuit line and the pads, thereby providing reproducible inductive/capacitive coupling.

FIG. 25C shows the sequence of conductive layers within the X2Y' of FIGS. 25A and 25B. FIG. 25C also shows the offset of the ends of the layers at the left side of the layers shown in FIG. 25B. However, as with other embodiments, vias may be used so that the shield layers may extend beyond the planar extent of the electrodes' conductive layers.

FIG. 26A shows in side partial sectional view a filter arrangement including an X2Y' of FIG. 25A-25C wherein the X2Y's energy conditioner is disposed on a conductive line of a circuit on a substrate. The internal locations of the A electrode pad and the B electrode pad are illustrated by dashed lines.

FIG. 26B is a plan view of the filter arrangement of FIG. 26A also showing the perimeters of the A and B electrode pads in dashed lines.

FIG. 27 is a schematic in plan view of a filter arrangement including a variation of the novel energy filter of FIGS. 25A-25C. The X2Y' energy filter of FIG. similar to the X2Y' of FIGS. 25A-25C in that it includes pads that are capacitively/inductively coupled and not in electrical contact with the circuit line, and the filter arrangement includes this X2Y' disposed on the conductive line. In contrast with the FIGS. 25A-25C X2Y', the X2Y' of FIG. 27 includes more than 2 electrodes. Specifically, it includes three electrodes and three electrode pads. Pads 1 and 2 are oriented transverse to the extension of the circuit line. Pad 3 is oriented longitudinally spaces from pads 1 and 2 relative to the extension of the circuit line. This X2Y' includes the X2Y' floating shield structure substantially individually enclosing each of the electrode structure's layers to provide very low inductance and high differential impedance effects between electrodes. If connected to a conductive line such that the pad 1 and pad 2 are coupled to the line as shown, they may experience time dependent transverse voltage differences and filter out those voltage differences. Moreover, the time dependent longitudinal voltage differences on the line should be filtered out by the existence of pad 3 longitudinally disposed relative to pads 1 and 2.

The capacitive/inductive coupling illustrated by the filter of FIG. 25A to FIG. FIG. 27 is compatible with all of the filter arrangements previously disclosed herein. Use of the capacitive/inductively coupled type of in any of the previously discussed filter arrangements is contemplated.

While FIG. 27 shows only 3 pads and discloses only three corresponding internally shielded electrodes, the inventors contemplate that more contact pads and electrodes may be useful. Specifically, the inventors recognize that high frequency propagation modes along a circuit line may be in various modes defined for example by solutions to boundary value equations defining the dimension of the circuit line and related transmission line characteristics. This suggests that an array of contact pads at various spatial distances from one another may be useful for filtering out high frequency modes from power or signal transmitted along a circuit line. Such arrays may include more than 3, such as from 4 to 500 pads and corresponding internally shielded electrode structures.

The combination of various electrodes and a conductive shielding structure can create a state of effective differential and common mode electromagnetic interference filtering and/or surge protection. Additionally, a circuit arrangement utilizing the invention will comprise of at least one line conditioning circuit component constructed with shaped electrode patterns that are provided on various surfaces of dielectric material with at least a portion of these respective electrode surfaces or edges operable for conductive coupling for electrically coupled energy transmissions to electrical conductors of the circuit.

The variously selected electrode patterns, dielectric material employed, and positioning and usage of an intervening, conductive shielding layer or structure create a commonality between paired, but oppositely positioned (relative to one another) electrodes operable for producing a balanced (equal but opposite) circuit arrangement position within the electrical component when it is coupled line-to-line between the electrical conductors and line-to-ground from the individual electrical conductors to internal, conductive shielding layer or structure within the component for circuit energy conditioning operations.

The particular electrical effects of the multi-functional energy conditioner are determined by the choice of material between the electrode plates and the use of an internally positioned, conductive shielding layer or structure which effectively house a substantial portion of the electrode layers within one or more Faraday-like, shielding structures.

The dielectric material used in conjunction with at least two oppositely positioned electrode plates with a conductive shielding layer or structure spaced in between will combine to create an line-to-line capacitance value that is approximately the value of the capacitance value of either one of the two line-to-shielding layer capacitors created, when energized.

If a metal oxide varistor (MOV) material is used, then the multi-functional energy conditioner will have over current and surge protection characteristics provided by the MOV-type material. The conductive shielding layer or structure in combination with the electrode plates will form at least one line-to-line capacitor and at least two line-to-ground capacitors, and will be operable for providing differential and common mode filtering.

During transient voltage conditions, varistor material, which is essentially a non-linear resistor used to suppress high voltage transients, will be operable to limit the transient voltage conditions or over voltage spikes that may appear between the electrical conductors.

The inventors contemplate embodiments in which vias or apertures are defined by conductive surfaces such that those conductive surfaces form a conductive pathway that can mechanically and electrically contact to one or more conductive layers or surfaces in the structures.

The inventors also contemplate that plates may be irregularly shaped as opposed to square, rectangular, or generally round, depending for example upon desired application.

The inventors also contemplate that vias may pass through conductive layers, such as layers forming the non-shielding electrodes, and layers forming the shielding electrode, without electrically contacting those layers in order to electrically connect, for example, layers of one electrode structure to one another without shorting that electrode structure to another electrode's structure.

The inventors contemplate modifying the energy conditioner embodiments disclosed in U.S. Pat. Nos. 6,018,448 and 6,373,673 (now published as WO 2004/07095) by modifying their conductive shield structure so that is designed to be conductively isolated from a circuit to which the conditioner's electrodes are designed to be conductively or capacitively/inductively connected. Thus, the conductive shield structure of those embodiments may be modified to cover the entire outer surface of the conductive shield structure with dielectric material. Optionally, some portion of the conductive shield structure may be uncovered, but recessed from adjacent surface regions of the structure.

The number of plates or the shield structure may be 1,3, at least 3, at least 5, at least 7, at least 9, or at least 21. The ratio of the total surface area of the shield structure to the total surface area of an electrode of the structure may be at least 0. at least 0.5, at least 1, at least 3, at least 5, or at least 10. The number of electrodes in any structure may be at least 2, at least 3, at least 4, at least 6, at least 10, at least 16, at least 32, or at least 64.

Preferably, the electrodes of the novel structures are designed to connect or capacitively/inductively couple to or are formed connected or capacitively/inductively coupled to conductive lines of a circuit, and the conductive shield structure is designed to be conductively insulated from lines of the circuit.

What is claimed is:

1. An energy conditioner comprising:
   an internally floating shield structure;
   a first electrode structure;
   a second electrode structure;
   wherein said first electrode structure comprises at least one first electrode structure first conductive layer, said second electrode structure comprises at least one second electrode structure first conductive layer;
   wherein said internally floating shield structure shields said first electrode structure first conductive layer from said second electrode structure, and said internally floating shield structure shields said second electrode structure first conductive layer from said first electrode structure; and
   said first electrode structure includes a first electrode contact region.

2. A filter arrangement comprising the energy conditioner of claim 1 and a conductive line segment of a circuit, wherein said first electrode structure contact region is electrically connected to said conductive line segment.

3. A capacitively/inductively coupling energy conditioner, comprising:
   an internally floating shield structure;
   a first electrode structure;
   a second electrode structure;
   wherein said first electrode structure comprises at least one first electrode structure first conductive layer, said second electrode structure comprises at least one second electrode structure first conductive layer;
   wherein said internally floating shield structure shields said first electrode structure first conductive layer from said second electrode structure, and said internally floating shield structure shields said second electrode structure first conductive layer from said first electrode structure; and
   said first electrode structure includes a first electrode capacitive/inductive coupling pad.

4. A filter arrangement comprising the capacitively/inductively coupling energy conditioner of claim 3 and a conductive line segment of a circuit, wherein first electrode capacitive/inductive coupling pad is capacitively/inductively coupled to said conductive line segment.

5. An internally shielded capacitor comprising;
a shielding conductive layer;
a first electrode defining at least a first electrode layer, wherein said first electrode layer is above said shielding conductive layer;
a second electrode defining at least a second electrode layer, wherein said second electrode layer is below said shielding conductive layer;
wherein said shielding, said first electrode, and said second electrode are electrically isolated from one another; and
wherein said first electrode, said second electrode, and said shielding conductive layer are positioned and sized relative to one another such that any straight line passing through said first electrode and said second electrode contacts said shielding conductive layer.

6. An energy conditioner comprising;
a shielding defining at least (1) upper shielding conductive layer, (2) a center shielding conductive layer, and (3) a lower shielding conductive layer, wherein said upper shielding conductive layer is above said center shielding conductive layer and said center shielding conductive layer is above said lower shielding conductive layer;
a first electrode defining at least a first electrode layer, wherein said first electrode layer is below said upper shielding conductive layer and above said center shielding conductive layer;
a second electrode defining at least a second electrode layer, wherein said second electrode layer is below said center shielding conductive layer and above said lower shielding conductive layer; and
wherein said shielding, said first electrode, and said second electrode are electrically isolated from one another; and
wherein said first electrode, said second electrode, and said center shielding conductive layer are positioned and sized relative to one another such that any straight line passing through said first electrode and said second electrode contacts said center shielding conductive layer.

7. The conditioner of claim 6, wherein said shielding further comprises at least one conductive aperture operable for conductively coupling together all of said shielding conductive layers to one another.

8. The conditioner of claim 6, wherein said shielding further comprises at least one conductive via structure operable for conductively coupling together all of said shielding conductive layers to one another.

9. The conditioner of claim 6, wherein said shielding further comprises at least one conductive aperture, wherein said at least one conductive aperture passes through at least said first electrode layer or said second electrode layer; and
wherein said at least one conductive aperture is operable for conductively coupling together all of said shielding conductive layers to one another.

10. The conditioner of claim 6, wherein said shielding further comprises at least one conductive via structure, wherein said at least one conductive via structure passes through at least said first electrode layer or said second electrode layer; and
wherein said at least one conductive via structure is operable for conductively coupling together all of said shielding conductive layers to one another.

11. The energy conditioner of claim 7, wherein said shielding is not operable to be physically coupled to a circuit path.

12. The energy conditioner of claim 8, wherein said shielding is not operable to be physically coupled to a circuit path.

13. A method of making an energy conditioner comprising:
providing an internally floating shield structure;
providing a first electrode structure;
providing a second electrode structure;
wherein said first electrode structure comprises at least one first electrode structure first conductive layer, said second electrode structure comprises at least one second electrode structure first conductive layer;
wherein said internally floating shield structure shields said first electrode structure first conductive layer from said second electrode structure, and said internally floating shield structure shields said second electrode structure first conductive layer from said first electrode structure; and
said first electrode structure includes a first electrode contact region.

14. A method of making filter arrangement comprising (1) an energy conditioner comprising an internally floating shield structure; a first electrode structure; a second electrode structure;
wherein said first electrode structure comprises at least one first electrode structure first conductive layer, said second electrode structure comprises at least second electrode structure first conductive layer; wherein said internally floating shield structure shields said first electrode structure first conductive layer from said second electrode structure, and said internally floating shield structure shields said second electrode structure first conductive layer from said first electrode structure; wherein said first electrode structure includes a first electrode contact region and (2) a conductive line segment of a circuit, wherein said first electrode structure contact region is electrically connected to said conductive line segment, comprising the steps of:
providing said energy conditioner;
providing said conductive line segment; and
electrically connecting said conductive line segment to said energy conditioner.

15. A method of making a capacitively/inductively coupling energy conditioner, comprising:
providing an internally floating shield structure;
providing a first electrode structure;
providing a second electrode structure;
wherein said first electrode structure comprises at least one first electrode structure first conductive layer, said second electrode structure comprises at least one second electrode structure first conductive layer;
wherein said internally floating shield structure shields said first electrode structure first conductive layer from said second electrode structure, and said internally floating shield structure shields said second electrode structure first conductive layer from said first electrode structure; and
said first electrode structure includes a first electrode capacitive/inductive coupling pad.

16. The method of making a circuit including the method of claim 15, and further comprising capacitively/inductively coupling said energy conditioner to a conductive line segment.

17. A method of making an internally shielded capacitor comprising;
providing a shielding conductive layer;
providing a first electrode defining at least a first electrode layer, wherein said first electrode layer is above said shielding conductive layer;

providing a second electrode defining at least a second electrode layer, wherein said second electrode layer is below said shielding conductive layer;

wherein said shielding, said first electrode, and said second electrode are electrically isolated from one another; and wherein said first electrode, said second electrode, and said shielding conductive layer are positioned and sized relative to one another such that any straight line passing through said first electrode and said second electrode contacts said shielding conductive layer.

18. A method of making an energy conditioner comprising;
providing a shielding defining at least (1) upper shielding conductive layer, (2) a center shielding conductive layer, and (3) a lower shielding conductive layer, wherein said upper shielding conductive layer is above said center shielding conductive layer and said center shielding conductive layer is above said lower shielding conductive layer;

providing a first electrode defining at least a first electrode layer, wherein said first electrode layer is below said upper shielding conductive layer and above said center shielding conductive layer;

providing a second electrode defining at least a second electrode layer, wherein said second electrode layer is below said center shielding conductive layer and above said lower shielding conductive layer; and wherein said shielding, said first electrode, and said second electrode are electrically isolated from one another; and wherein said first electrode, said second electrode, and said center shielding conductive layer are positioned and sized relative to one another such that any straight line passing through said first electrode and said second electrode contacts said center shielding conductive layer.

19. The method of claim 18, wherein said shielding further comprises at least one conductive aperture operable for conductively coupling together all of said shielding conductive layers to one another.

20. The method of claim 18, wherein said shielding further comprises at least one conductive via structure operable for conductively coupling together all of said shielding conductive layers to one another.

21. The method claim 18, wherein said shielding further comprises at least one conductive aperture, wherein said at least one conductive aperture passes through at least said first electrode layer or said second electrode layer; and wherein said at least one conductive aperture is operable for conductively coupling together all of said shielding conductive layers to one another.

22. The method of claim 18, wherein said shielding further comprises at least one conductive via structure, wherein said at least one conductive via structure passes through at least said first electrode layer or said second electrode layer; and wherein said at least one conductive via structure is operable for conductively coupling together all of said shielding conductive layers to one another.

23. The method of claim 19, wherein said shielding is designed to be physically isolated from a circuit path.

24. The energy conditioner of claim 20, wherein said shielding is designed be physically isolated from a circuit path.

25. A method of using an energy conditioner, said energy conditioner comprising:
an internally floating shield structure; a first electrode structure; a second electrode structure; wherein said first electrode structure comprises at least one first electrode structure first conductive layer, said second electrode structure comprises at least one second electrode structure first conductive layer; wherein said internally floating shield structure shields said first electrode structure first conductive layer from said second electrode structure, and said internally floating shield structure shields said second electrode structure first conductive layer from said first electrode structure; and said first electrode structure includes a first electrode contact region, said method comprising:

connecting said energy conditioner in an electrical circuit.

26. A method of using a capacitively/inductively coupling energy conditioner, said energy conditioner comprising: an internally floating shield structure; a first electrode structure; a second electrode structure; wherein said first electrode structure comprises at least one first electrode structure first conductive layer, said second electrode structure comprises at least one second electrode structure first conductive layer; wherein said internally floating shield structure shields said first electrode structure first conductive layer from said second electrode structure, and said internally floating shield structure shields said second electrode structure first conductive layer from said first electrode structure; and said first electrode structure includes a first electrode capacitive/inductive coupling pad, said method comprising:

connecting said energy conditioner in an electrical circuit.

27. A method of using an internally shielded capacitor, said internally shielded capacitor comprising: a shielding conductive layer; a first electrode defining at least a first electrode layer, wherein said first electrode layer is above said shielding conductive layer; a second electrode defining at least a second electrode layer, wherein said second electrode layer is below said shielding conductive layer; wherein said shielding, said first electrode, and said second electrode are electrically isolated from one another; and wherein said first electrode, said second electrode, and said shielding conductive layer are positioned and sized relative to one another such that any straight line passing through said first electrode and said second electrode contacts said shielding conductive layer, said method comprising:

connecting said internally shielded capacitor in an electrical circuit.

28. A method of using an energy conditioner, said energy conditioner comprising: a shielding defining at least (1) upper shielding conductive layer, (2) a center shielding conductive layer, and (3) a lower shielding conductive layer, wherein said upper shielding conductive layer is above said center shielding conductive layer and said center shielding conductive layer is above said lower shielding conductive layer; a first electrode defining at least a first electrode layer, wherein said first electrode layer is below said upper shielding conductive layer and above said center shielding conductive layer; a second electrode defining at least a second electrode layer, wherein said second electrode layer is below said center shielding conductive layer and above said lower shielding conductive layer; and wherein said shielding, said first electrode, and said second electrode are electrically isolated from one another; and wherein said first electrode, said second electrode, and said center shielding conductive layer are positioned and sized relative to one another such that any straight line passing through said first electrode and said second electrode contacts said center shielding conductive layer, said method comprising:

connecting said energy conditioner in an electrical circuit.

29. The method of claim 28, wherein said shielding further comprises at least one conductive aperture operable for conductively coupling together all of said shielding conductive layers to one another.

30. The method of claim 28, wherein said shielding further comprises at least one conductive via structure operable for conductively coupling together all of said shielding conductive layers to one another.

31. The method of claim 28, wherein said shielding further comprises at least one conductive aperture, wherein said at least one conductive aperture passes through at least said first electrode layer or said second electrode layer; and wherein said at least one conductive aperture is operable for conductively coupling together all of said shielding conductive layers to one another.

32. The method of claim 28, wherein said shielding further comprises at least one conductive via structure, wherein said at least one conductive via structure passes through at least said first electrode layer or said second electrode layer; and wherein said at least one conductive via structure is operable for conductively coupling together all of said shielding conductive layers to one another.

33. The method of claim 29, wherein said shielding is designed to be physically isolated from a circuit path.

34. The method of claim 30, wherein said shielding is designed to be physically isolated from a circuit path.

* * * * *